(12) United States Patent
Huang et al.

(10) Patent No.: US 8,605,350 B2
(45) Date of Patent: Dec. 10, 2013

(54) TUNABLE PHOTOVOLTAIC ELECTROCHROMIC DEVICE AND MODULE

(75) Inventors: Lee-May Huang, Hsinchu (TW);
Chen-Pang Kung, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 366 days.

(21) Appl. No.: 13/113,109

(22) Filed: May 23, 2011

(65) Prior Publication Data
US 2011/0286071 A1    Nov. 24, 2011

(30) Foreign Application Priority Data

May 24, 2010    (TW) ................ 99116504 A

(51) Int. Cl.
*G02F 1/15*    (2006.01)
(52) U.S. Cl.
USPC .......................................... 359/265
(58) Field of Classification Search
USPC .................. 359/265, 273, 274; 136/257
See application file for complete search history.

(56) References Cited

U.S. PATENT DOCUMENTS

| | | | |
|---|---|---|---|
| 5,377,037 A | 12/1994 | Branz et al. | |
| 5,384,653 A * | 1/1995 | Benson et al. | 359/270 |
| 5,973,819 A | 10/1999 | Pletcher et al. | |
| 6,369,934 B1 | 4/2002 | Bechinger et al. | |
| 6,614,577 B1 | 9/2003 | Yu et al. | |
| 7,489,431 B2 | 2/2009 | Malmstrom et al. | |

FOREIGN PATENT DOCUMENTS

| | | |
|---|---|---|
| TW | 200417280 | 9/2004 |
| TW | 201003931 | 1/2010 |
| TW | I321170 | 3/2010 |

OTHER PUBLICATIONS

"Office Action of Taiwan Counterpart Application", issued on Aug. 13, 2013, p1-p3, in which the listed references were cited.

* cited by examiner

*Primary Examiner* — Joseph P Martinez
(74) *Attorney, Agent, or Firm* — Jianq Chyun IP Office

(57) ABSTRACT

A tunable photovoltaic electrochromic (PV-EC) device and module are provided. The device includes a transparent substrate, a thin film solar cell on the transparent substrate, a transparent conductive layer located on the transparent substrate beside the thin film solar cell, an EC material covering an exposed surface of the transparent conductive layer and the thin film solar cell, a switching apparatus, and a charge-discharge device coupled to the switching apparatus. The transparent conductive layer and a cathode layer of the thin film solar cell respectively serve as the anode and the cathode of the EC material simultaneously. The switching apparatus is electrically connected to the transparent conductive layer and electrically connected to the anode layer and the cathode layer of the thin film solar cell. The switching apparatus enters a control mode through a switch control signal.

44 Claims, 25 Drawing Sheets

TUNABLE PHOTOVOLTAIC ELECTROCHROMIC DEVICE AND MODULE

CROSS-REFERENCE TO RELATED APPLICATION

This application claims the priority benefit of Taiwan application serial no. 99116504, filed May 24, 2010. The entirety of the above-mentioned patent application is hereby incorporated by reference herein and made a part of this specification.

TECHNICAL FIELD

The disclosure relates to a tunable photovoltaic electrochromic (PV-EC) device and module.

BACKGROUND

A typical electrochromic (EC) device is categorized into a solid-type or a liquid-type. The structure of the solid-type EC device is formed on a transparent substrate, and a plurality of coating layers (e.g., a transparent conductive layer, an EC thin film, a solid electrolyte, and an ion storage layer) having different functions are successively vacuum deposited on the substrate. By contrast, the structure of the liquid-type EC device is formed by two conductive transparent substrates, wherein EC coating layer, ion storage layer, and an electrolyte solution are disposed between the two conductive transparent substrates.

Compared to electrochromic device which has been developed for some time, the integration of photovoltaic (PV) and electrochromic (EC) provides better efficiency in saving energy, for the photovoltaic electrochromic (PV-EC) device can achieve color change in EC layers without additional power supply. Researches that integrate photovoltaic technology have provided diverse application of electrochromic device, for instance, building integrated photovoltaic (BIPV) may be cooperated with the electrochromic technology to automatically adjust the colors of electrochromic windows to reduce indoor heat.

There are two types of solar powered EC devices, dye-sensitized solar cell (DSSC) and silicon based PV-EC device. The DSSC-EC technology separates the photoabsorbing layer-$TiO_2$ and the EC layer to the anode and the cathode respectively for constituting a device. At the beginning, this technology is developed based on the concept of using compound films of a Prussian blue electrochromic thin film and a photosensitive layer-$TiO_2$ for performing color change. In recent years, such a concept has been further extended to separate the photosensitive layer and the electrochromic layer to the anode and the cathode respectively for constituting a device. This device can be described as having EC materials inserted into DSSC which has become the most widely-discussed topic in the research of the integration of photovoltaic and electrochromic technology. However, to apply such a structure to practical applications, many problems need to be overcome, such as the long term stability of the photosensitive layer or the feasibility of developing devices having large dimensions.

Another research is a stand alone side-by-side integration of a silicon thin film solar cell with an EC device, an appropriate switches are employed to control the EC device and the thin film solar cell, as was disclosed in U.S. Pat. No. 5,384,653. A control box disclosed in this patent switches the colored/bleached state of the EC device through the solar cell or a battery.

Moreover, U.S. Pat. No. 5,377,037 disclosed a design of monolithic integration of a silicon thin film solar cell and an EC device on one single substrate. Specifically, a silicon thin film solar cell and an inorganic EC device are combined on a first conductive glass substrate by conducting a tandem approach, then another transparent conductive glass substrate is disposed on the opposite side facing the thin film solar cell. A liquid organic electrolyte solution or a solid inorganic electrolyte layer is disposed between the two substrates. In said device, a preset bleed resistor is applied to accomplish a switch control of the EC material, and the bleed resistor connects the EC material and the thin film solar cell.

SUMMARY

A tunable photovoltaic EC device is introduced herein. The tunable photovoltaic EC device at least includes a transparent substrate, a thin film solar cell, a first transparent conductive layer, an EC material, and a first switching apparatus. The thin film solar cell is located on the transparent substrate and has an anode layer, a cathode layer, and a photoelectric conversion layer between the anode layer and the cathode layer. The first transparent conductive layer is located on the transparent substrate beside the thin film solar cell, and the first transparent conductive layer and the thin film solar cell are not mutually contacted. The EC material at least covers an exposed surface of the first transparent conductive layer and the thin film solar cell. The first transparent conductive layer and the cathode layer of the thin film solar cell respectively act as the anode and the cathode of the EC material. The first switching apparatus is electrically connected to the first transparent conductive layer and electrically connected to the anode layer and the cathode layer of the thin film solar cell. The first switching apparatus enters a control mode through at least one switch control signal.

A tunable photovoltaic EC module is further introduced herein. The tunable photovoltaic EC module at least includes a transparent substrate, thin film solar cells, first insulation layers, first transparent conductive layers, EC materials, and a first switching apparatus. The thin film solar cells are located on the transparent substrate. Each of the thin film solar cells at least has an anode layer, a cathode layer, and a photoelectric conversion layer between the anode layer and the cathode layer. One of the anode layer and the cathode layer has an exposed surface exposed between the thin film solar cells. Each of the first transparent conductive layers is respectively located on the exposed surface, and each of the first insulation layers is respectively located between the exposed surface and each of the first transparent conductive layers. The EC materials respectively cover an exposed surface of at least one of the first transparent conductive layers and at least one of the thin film solar cells. Here, the first transparent conductive layers and the cathode layers of the thin film solar cells simultaneously serve as the anodes and the cathodes of the EC materials. The first switching apparatus is electrically connected to one of the first transparent conductive layers under one of the EC materials and electrically connected to the anode layer and the cathode layer of one of the thin film solar cells under one of the EC materials. The first switching apparatus enters a control mode through at least one switch control signal.

Based on the above, in the structure of the disclosure, the EC system (i.e., the transparent conductive layer and the EC material) is designed to share the cathode with the thin film solar cell, and the anode of the EC system is an isolated transparent conductive layer. Thereby, an external circuit design can be applied to control a potential difference between the anode and the cathode of the EC system, so as to form a device switch and meanwhile achieve an effect of color changing uniformity.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate embodiments and, together with the description, serve to explain the principles of the disclosure.

DETAILED DESCRIPTION OF DISCLOSED EMBODIMENTS

Figure 1:
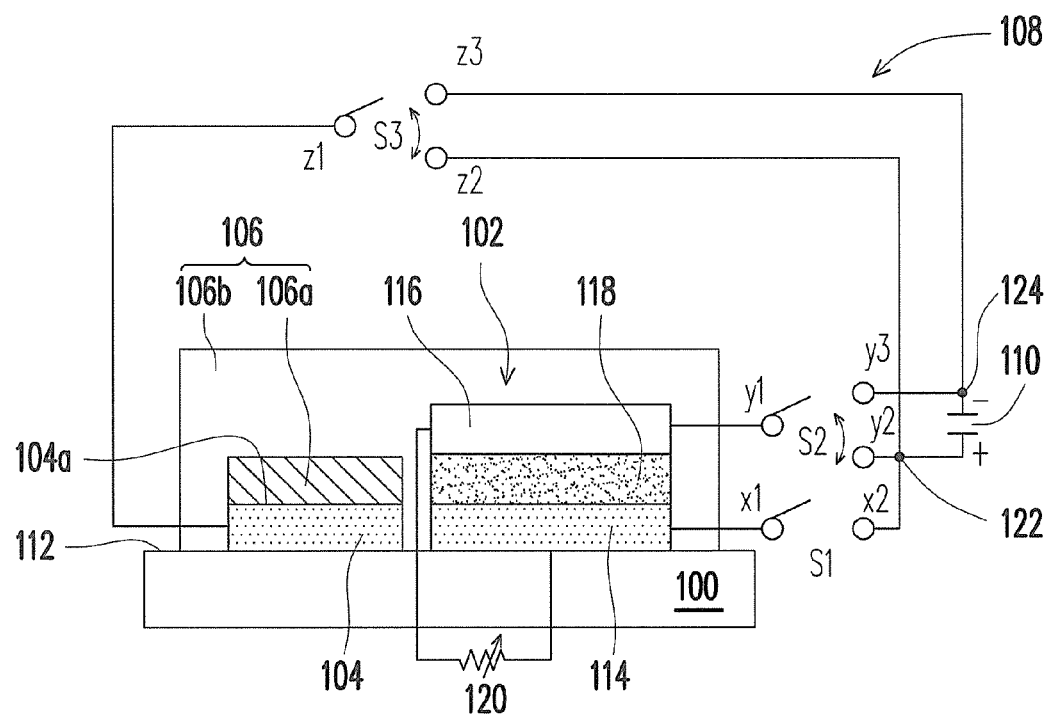
FIG. 1 is a schematic cross-sectional view illustrating a tunable photovoltaic electrochromic (EC) device according to a first exemplary embodiment of the disclosure.

FIG. 1 is a schematic cross-sectional view illustrating a tunable photovoltaic electrochromic (EC) device according to a first exemplary embodiment of the disclosure.

With reference to FIG. 1, the tunable photovoltaic EC device of the first exemplary embodiment includes a transparent substrate 100, a thin film solar cell 102, a first transparent conductive layer 104, an EC material 106, a first switching apparatus 108, and a first charge-discharge device 110. The transparent substrate 100 is, for instance, a glass substrate, a plastic substrate, or a flexible substrate. The thin film solar cell 102 is located on a surface 112 of the transparent substrate 100. Here, the thin film solar cell 102 at least has an anode layer 114, a cathode layer 116, and a photoelectric conversion layer 118 between the anode layer 114 and the cathode layer 116. In the first exemplary embodiment, the thin film solar cell 102 is, for instance, a silicon thin film solar cell, a copper indium gallium (di)selenide (CIGS) thin film solar cell, a cadmium telluride (CdTe) thin film solar cell, or other suitable solar cells. Moreover, an external loop impedance 120 capable of tuning an impedance value can be further added to the tunable PV-EC device. The external loop impedance 120 is coupled to the anode layer 114 and the cathode layer 116 of the thin film solar cell 102 for controlling a color changing degree of the EC material 106. When this exemplary embodiment is applied to a module having serially connected structures, for instance, the external loop impedance 120 can result in a balanced charge distribution of each single thin film solar cell 102 when each thin film solar cell 102 is irradiated by light, so as to uniformize the color changing effects on the entire module.

Since the tunable PV-EC device of the disclosure has an integrated structure, the EC material 106 covers the first transparent conductive layer 104 and the thin film solar cell 102. Under light exposure the photovoltage and the photocurrent generated by the thin film solar cell induces charges motion in the EC material which stimulates a color changing redox reaction.

The first transparent conductive layer 104 and the thin film solar cell 102 are planarly distributed on a substrate arrange in striped pattern. By using the first switching apparatus 108 to electrically connect the first transparent conductive layer 104 to the anode layer 114 and the cathode layer 116 of the thin film solar cell 102, the first transparent conductive layer 104 and the cathode layer 116 of the thin film solar cell 102 may serve as the anode and the cathode of the EC material 106.

As shown in FIG. 1, the first transparent conductive layer 104 is located on the transparent substrate 100 beside the thin film solar cell 102, and the EC material 106 at least covers an exposed surface 104a of the first transparent conductive layer 104 and the thin film solar cell 102. The first switching apparatus 108 is electrically connected to the first transparent conductive layer 104 and electrically connected to the anode layer 114 and the cathode layer 116 of the thin film solar cell 102, and the first switching apparatus 108 enters a control mode through at least one switch control signal. Simultaneously, the first transparent conductive layer 104 and the cathode layer 116 of the thin film solar cell 102 respectively serve as the anode and the cathode of the EC material 106. The first charge-discharge device 110 is coupled to the first switching apparatus 108 for storing a current received from the thin film solar cell 102 and/or providing power to the first transparent conductive layer 104. Here, the first charge-discharge device 110 is, for instance, a capacitor or a battery.

In the first exemplary embodiment, the EC material 106 includes a first EC thin film 106a and a gel or solid electrolyte 106b that covers the first EC thin film 106a and the thin film solar cell 102. A material of the first EC thin film 106a is, for instance, a Prussian Blue derivative or a polymer formed by polymerizing aniline monomer, EDOT monomer, or Viologen monomer.

The first EC thin film 106a, for example, may be a transition metal oxide selected from a transition metal oxide group consisting of $WO_3$, $MoO_3$, $V_2O_5$, $Cu_2O$, $Nb_2O_5$, NiO, SnO, $Fe_2O_3$, CoO, $Ir_2O_3$, $Rh_2O_3$, and $MnO_2$, and the transition metal is selected from metal, alloy, hydride, chalcogenide, and telluride formed by a transition metal group consisting of Mn, Mg, Co, Cu, Ni, Zn, V, Cr, Fe, Bi, Sb, Au, Pt, Ag, Ti, Nb, Te, and Se. For instance, the transition metal hydride is selected from a group consisting of Sb—Cu, Sb—Al, Mg, Mg—Ti, and Mg—Ni; the transition metal chalcogenide is selected from a group consisting of NbSe and $TiS_2$; the transition metal telluride is selected from a group consisting of $NbTe_2$. The optical characteristics of the transition metal thin film are changed after the transition metal thin film is exposed to dilute hydrogen gas or after the transition metal thin film is in contact with alkaline electrolyte or after the transition metal thin film is inserted with lithium.

The gel or solid electrolyte 106b, for instance, contains alkali metal salt, solvent, and polymer materials. Here, the alkali metal salt is, for instance, lithium triflate, lithium perchlorate, or tetra alkyl ammonium salt; the solvent is, for instance, propylene carbonate, ethylene carbonate, γ-butyrolactone, acetonitrile, tetrahydrofuran (THF), or N-methyl-2-pyrrolidone (NMP); the polymer material is, for instance, polyethylene oxide, polypropylene oxide, poly vinyl butyral (PVB), or polymethylmeth-acrylate.

In addition, in the case when the transition metal or the transition metal oxide acting as the EC thin film 106a, the solid electrolyte 106b can be formed on the surface of the transparent substrate 100 by continuous vacuum deposition. The solid electrolyte 106b is, for instance, an inorganic electrolyte that includes $Li_xTaO_y$, LiPON, $Ta_2O_5$, $ZrO_2$, $MgF_2$, $Li_2O$, $Al_2O_3$ and so on.

The film-forming method of the EC material 106 includes electro deposition, coating, sol-gel, and vacuum coating, e.g., electron beam evaporation, thermal evaporation, ion-assisted coating, reactive and non-reactive sputtering, chemical vapor deposition (CVD), plasma enhanced CVD, and atmospheric pressure CVD. A mask can also be applied in the film-forming process to alter the area of deposition.

In the first exemplary embodiment, the anode and the cathode of the first charge-discharge device 110 are coupled to the first switching apparatus 108 through a first node 122 and a second node 124, respectively. The first switching apparatus 108, for instance, has a first switch S1, a second switch S2, and a third switch S3. The first, second, and third switches S1, S2, and S3 are, for instance, transistor switches, mechanical switches, or light control switches. The first switch S1 has a first end x1 and a second end x2. The first end x1 is coupled to the anode layer 114, and the second end x2 is coupled to the first node 122. The second switch S2 has a first end y1, a second end y2, and a third end y3. The first end y1 is coupled to the cathode layer 116, the second end y2 is coupled to the first node 122, and the third end y3 is coupled to the second node 124. The third switch S3 has a first end z1, a second end z2, and a third end z3. The first end z1 is coupled to the transparent conductive layer 104, the second end z2 is coupled to the first node 122, and the third end z3 is coupled to the second node 124.

Figure 2:
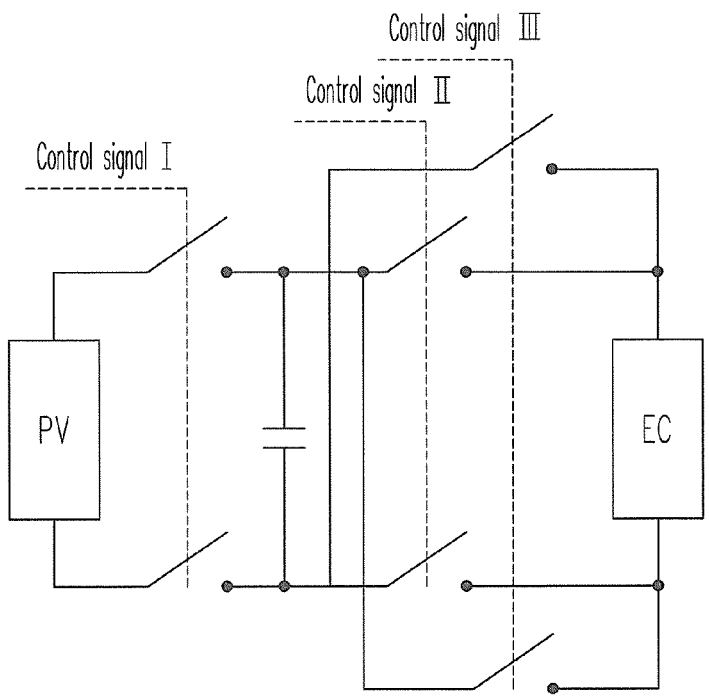
FIG. 2 is a circuit diagram of the tunable photovoltaic EC device of FIG. 1.

In addition to the first switching apparatus 108 of the first exemplary embodiment shown in FIG. 1, other switching apparatuses are applicable as long as these apparatuses comply with the circuit diagram shown FIG. 2. In FIG. 2, PV represents the thin film solar cell 102 of FIG. 1, EC represents the EC material 106 of FIG. 1, and the charge-discharge device (shown as a capacitor in FIG. 2) is connected between PV and EC. The switching apparatus depicted FIG. 2 can enter various control modes according to switch control signals I, II, and III.

The first switching apparatus 108 shown FIG. 1 is taken as an example to describe the applicable the control modes of the switching apparatus of the disclosure with reference to FIG. 3A to FIG. 3E.

Figure 3A:
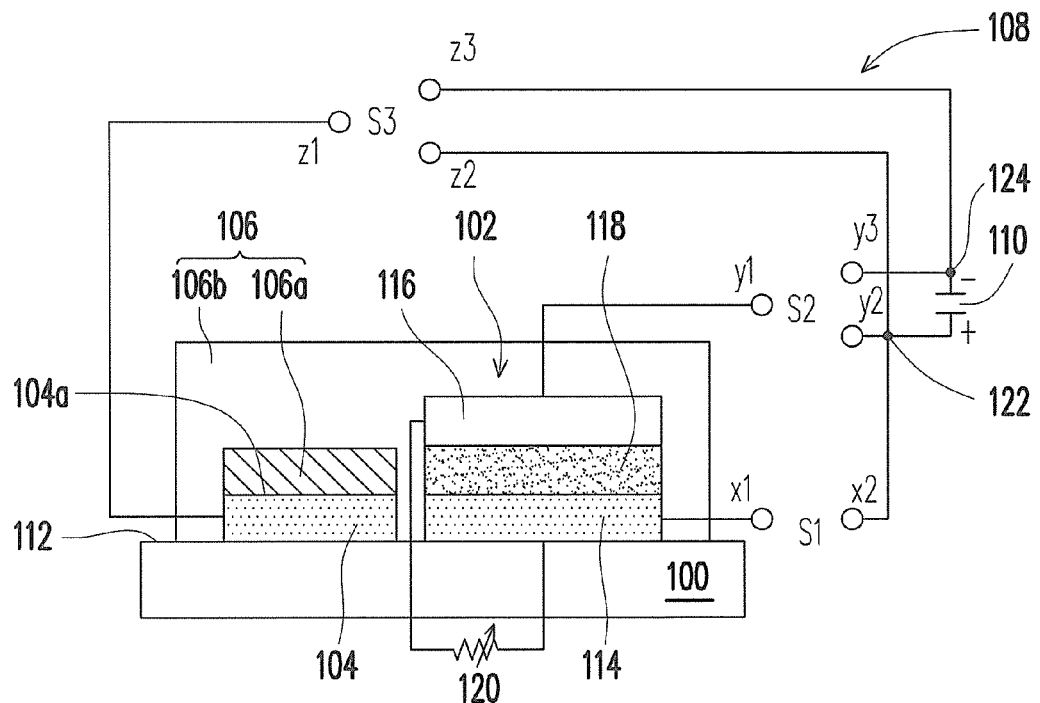
FIG. 3A to FIG. 3E are schematic circuit diagrams illustrating various control modes performed by the tunable photovoltaic EC device of FIG. 1 and by the switching apparatus therein.

First, the control mode shown in FIG. 3A is an idle mode. During a period of the idle mode, the first switch S1, the second switch S2, and the third switch S3 are all in an OFF state.

Figure 3B:
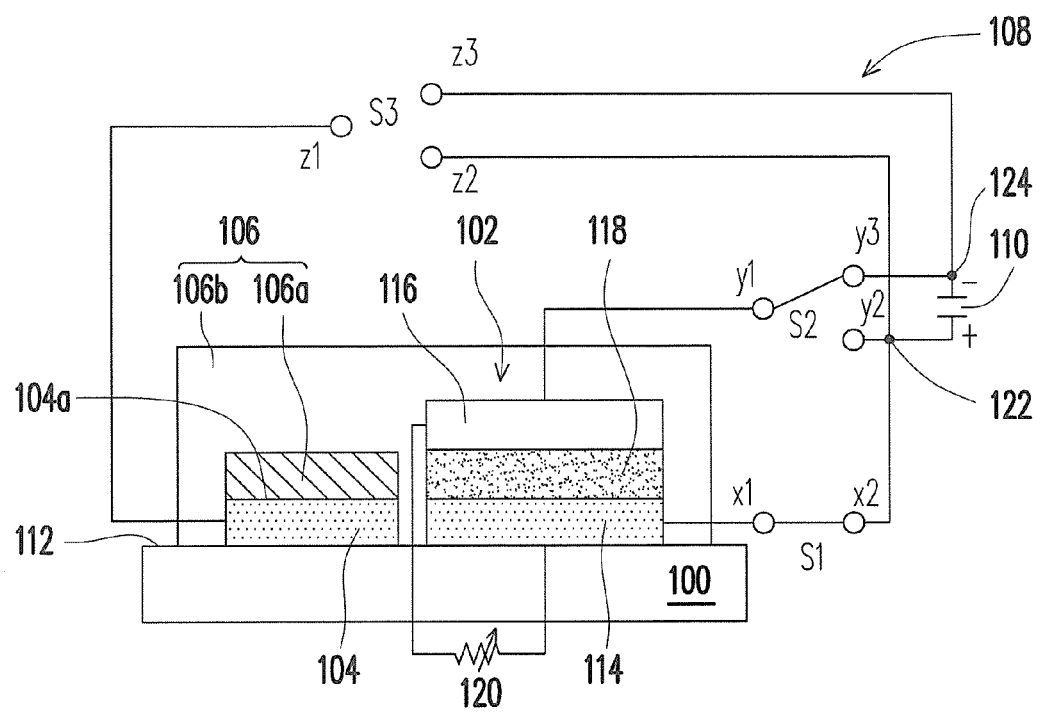

The control mode shown in FIG. 3B is a charging mode. During a period of the charging mode, the first switch S1 is in an ON state (i.e. the first end x1 and the second end x2 are connected), the first end y1 and the third end y3 of the second switch S2 are connected, and the third switch S3 is in the OFF state. Therefore, the current generated by the thin film solar cell 102 due to the light irradiation is stored in the first charge-discharge device 110.

Figure 3C:
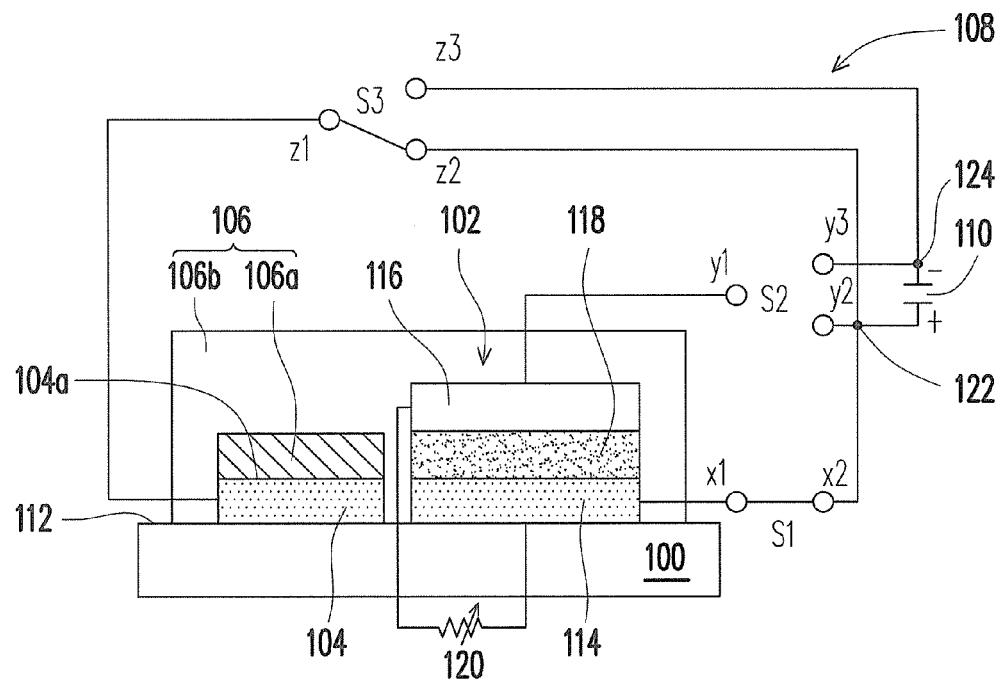

The control mode shown in FIG. 3C is an EC mode. During a period of the EC mode, the first switch S1 is in the ON state, the second switch S2 is in the OFF state, and the first end z1 and the second end z2 of the third switch S3 are connected, such that the current generated by the thin film solar cell 102 is provided to the first transparent conductive layer 104, and that the EC material 106 is driven to change color.

Figure 3D:
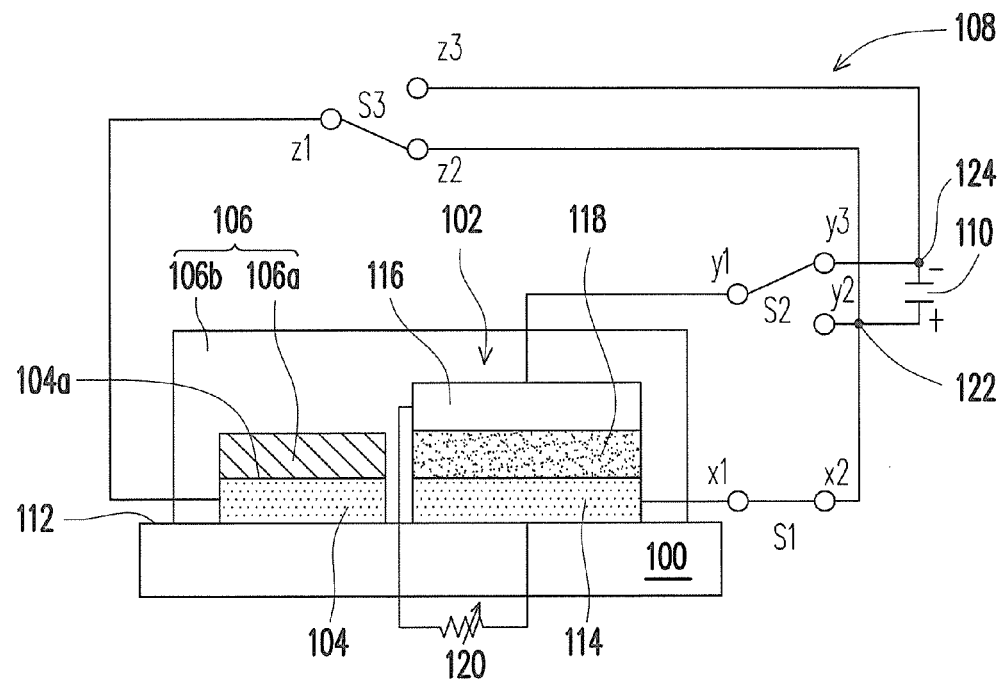

The control mode shown in FIG. 3D is a charging-EC mode. During a period of the charging-EC mode, the first switch S1 is in the ON state, the first end y1 and the third end y3 of the second switch S2 are connected, and the first end z1 and the second end z2 of the third switch S3 are connected. Therefore, through the first node 122, the current generated by the thin film solar cell 102 can be provided to the first transparent conductive layer 104 and stored in the first charge-discharge device 110.

Figure 3E:
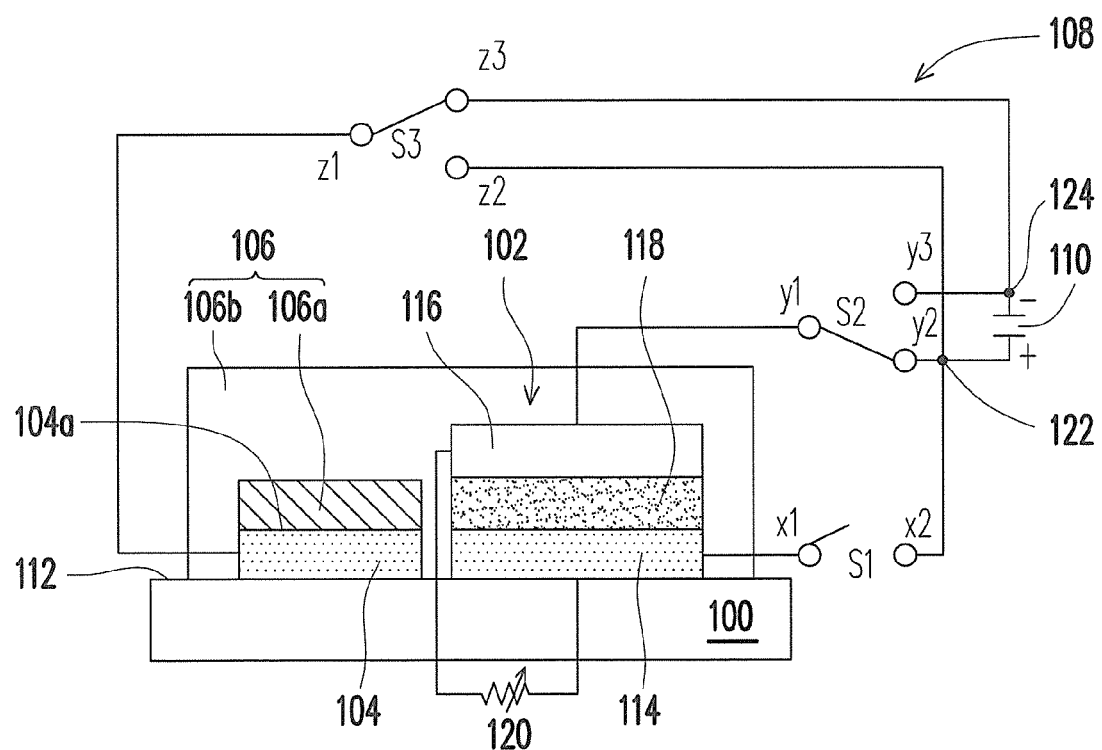

The control mode shown in FIG. 3E is a bleaching mode. During a period of the bleaching mode, the first switch S1 is in the OFF state, the first end y1 and the second end y2 of the second switch S2 are connected, and the first end z1 and the third end z3 of the third switch S3 are connected. Therefore, the cathode of the first charge-discharge device 110 is electrically connected to the first transparent conductive layer 104, and the anode of the first charge-discharge device 110 is electrically connected to the cathode layer 116 of the thin film solar cell 102. In this case, the first charge-discharge device 110 provides a reverse potential to the first transparent conductive layer 104, so as to bleach the EC material 106.

The first exemplary embodiment is an example of the disclosure, and the switching apparatus, the thin film solar cell, and the EC material therein may have various variations, which are described below.

Figure 4A:
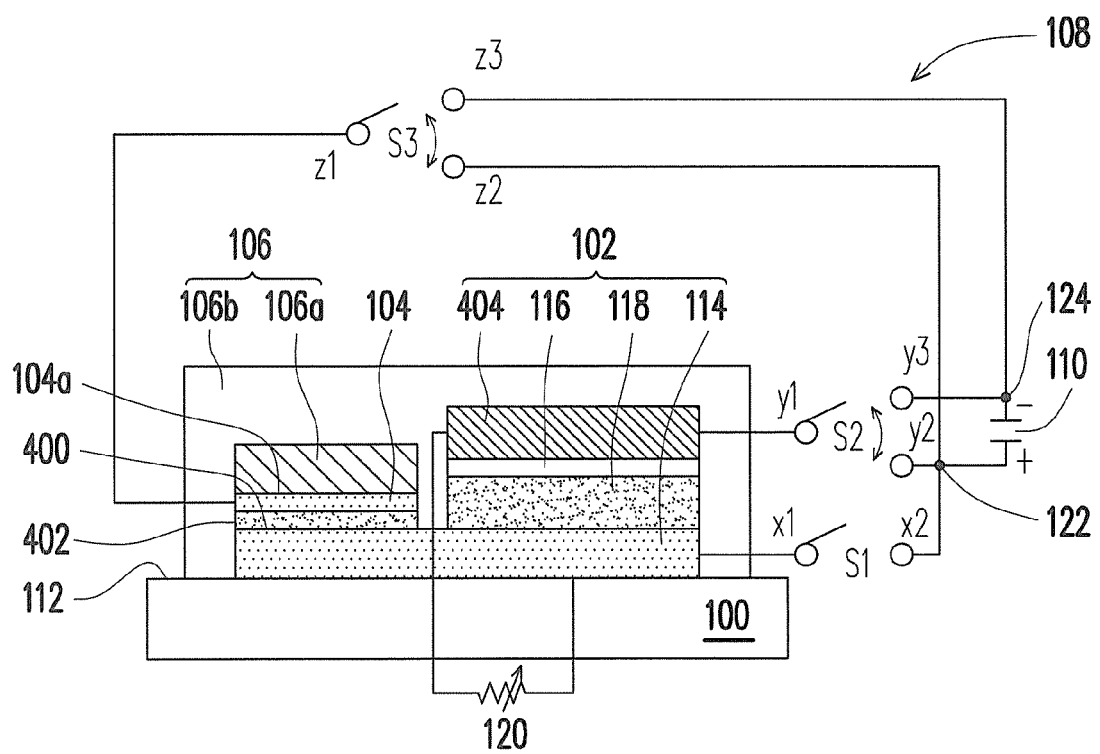
FIG. 4A to FIG. 4C are schematic cross-sectional views illustrating several tunable photovoltaic EC devices according to a second exemplary embodiment of the disclosure.

FIG. 4A is a schematic cross-sectional view illustrating a tunable PV-EC device according to a second exemplary embodiment of the disclosure. It should be noted that the same reference numerals as in the first embodiment are used herein to represent the same components.

With reference to FIG. 4A, the tunable PV-EC device described in the second exemplary embodiment is similar to the tunable PV-EC device described in the first exemplary embodiment. Specifically, the tunable PV-EC device in the second exemplary embodiment includes a transparent substrate 100, a thin film solar cell 102, a first transparent conductive layer 104, an EC material 106, a first switching apparatus 108, and a first charge-discharge device 110. The difference therebetween lies in that the anode layer 114 of the thin film solar cell 102 in the second exemplary embodiment has an exposed surface 400. A first insulation layer 402 is formed on the exposed surface 400, and the first transparent conductive layer 104 is located on the first insulation layer 402. A material of the cathode layer 116 of the thin film solar cell 102 is usually transparent conductive oxide (TCO). Hence, a metal layer 404 (e.g., silver, gold, or platinum) can be formed on the cathode layer 116 to facilitate electrical conduction, to improve the photoelectric conversion efficiency, and to enhance coloring and bleaching stability of the tunable PV-EC device. Here, the first end y1 of the second switch S2 in the switching apparatus 108 can be coupled to the metal layer 404.

Moreover, when this exemplary embodiment is applied to a module having serially connected structures, the metal layer 404 can be replaced by a photoresistor thin film, and thereby the photoresistor thin films with different impedances can be used to control color gradient of the EC materials 106 and achieve a grayscale effect of the module.

Figure 4B:
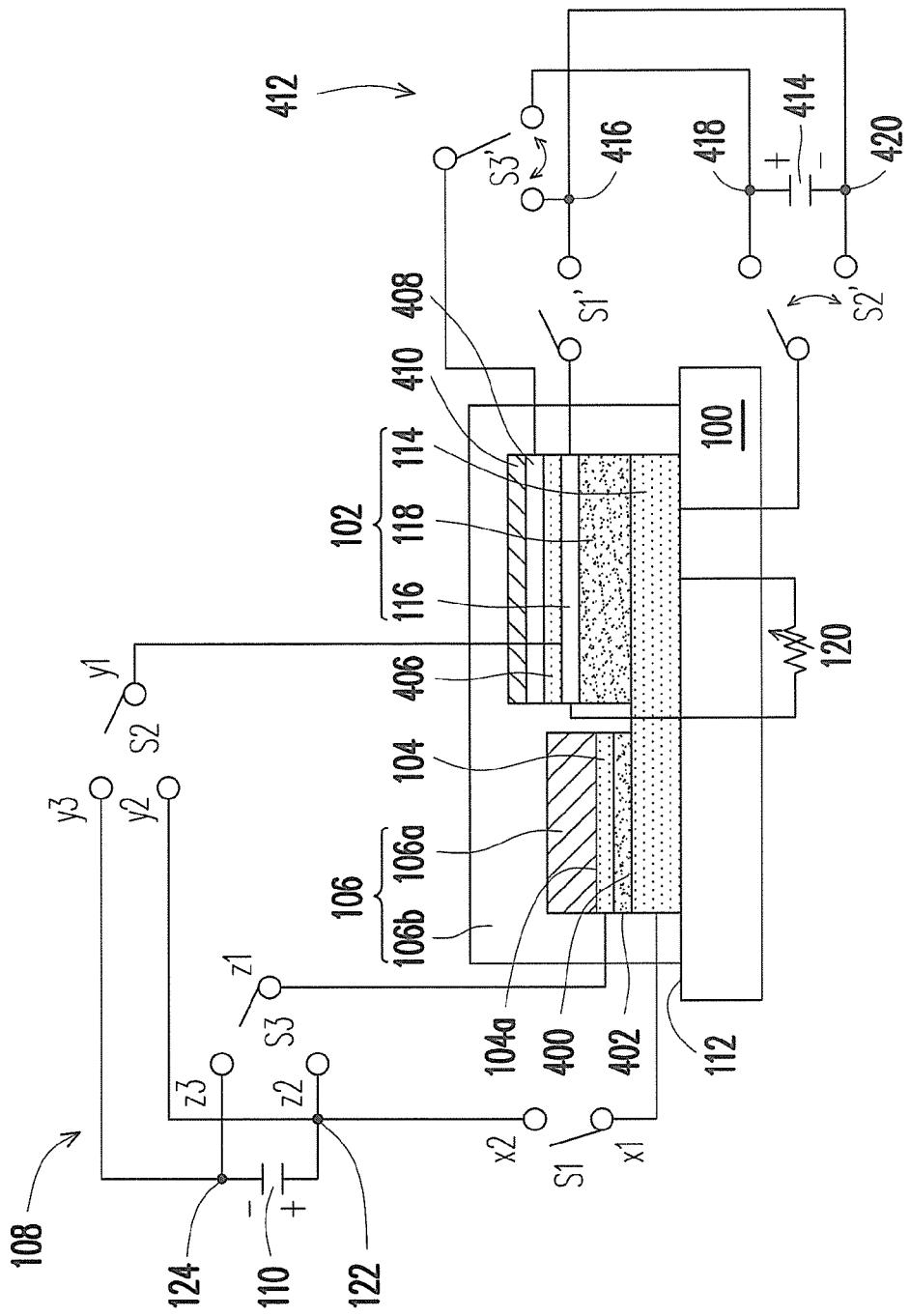

FIG. 4B is a schematic cross-sectional view illustrating another tunable PV-EC device according to the second exemplary embodiment of the disclosure. It should be noted that the same reference numerals as shown in FIG. 4A are used herein to represent the same components. In FIG. 4B, a second insulation layer 406 can be formed on the cathode layer 116 of the thin film solar cell 102, and a second transparent conductive layer 408 and the EC material 106 can be formed on the second insulation layer 406. The EC material 106 includes a first EC thin film 106a, a second EC thin film 410, and a gel or solid electrolyte 106b that covers the first EC thin film 106a and the second EC thin film 410. A second switching apparatus 412 and a second charge-discharge device 414 are used to tune the color of the second EC thin film 410 on the cathode layer 116. In addition, it is likely to form the second EC thin film 410 on the second transparent conductive layer 408 without forming the first EC thin film 106a thereon. At this time, the gel or solid electrolyte 106b directly covers the first transparent conductive layer 104 and the second EC thin film 410.

To increase light transmittance of the thin film solar cell 102, the cathode layer 116 is formed by TCO. The second switching apparatus 412 is electrically connected to the second transparent conductive layer 408 and electrically connected to the anode layer 114 and the cathode layer 116 of the thin film solar cell 102, and the second switching apparatus 412 enters the control mode through the switch control signal. Here, the second switching apparatus 412 is, for instance, a transistor switch, a mechanical switch, or a light control switch. The second charge-discharge device 414 is coupled to the second switching apparatus 412 for storing a current received from the thin film solar cell 102 and/or providing power to the second transparent conductive layer 408. Here, the second charge-discharge device 414 is, for instance, a capacitor or a battery.

In FIG. 4B, the second switching apparatus 412 has a first switch S1', a second switch S2' and a third switch S3', for instance. One end of the first switch S1' is coupled to the cathode layer 116, and the other end thereof is coupled to a first node 416. One end of the second switch S2' is coupled to the anode layer 114, and the other two ends thereof are respectively coupled to a second node 418 and a third node 420. One end of the third switch S3' is coupled to the second transparent conductive layer 408, and the other two ends thereof are respectively coupled to the first node 416 and the second node 418. The first node 416 and the third node 420 are connected. The anode and the cathode of the second charge-discharge device 414 are respectively coupled to the second node 418 and the third node 420.

Figure 4C:
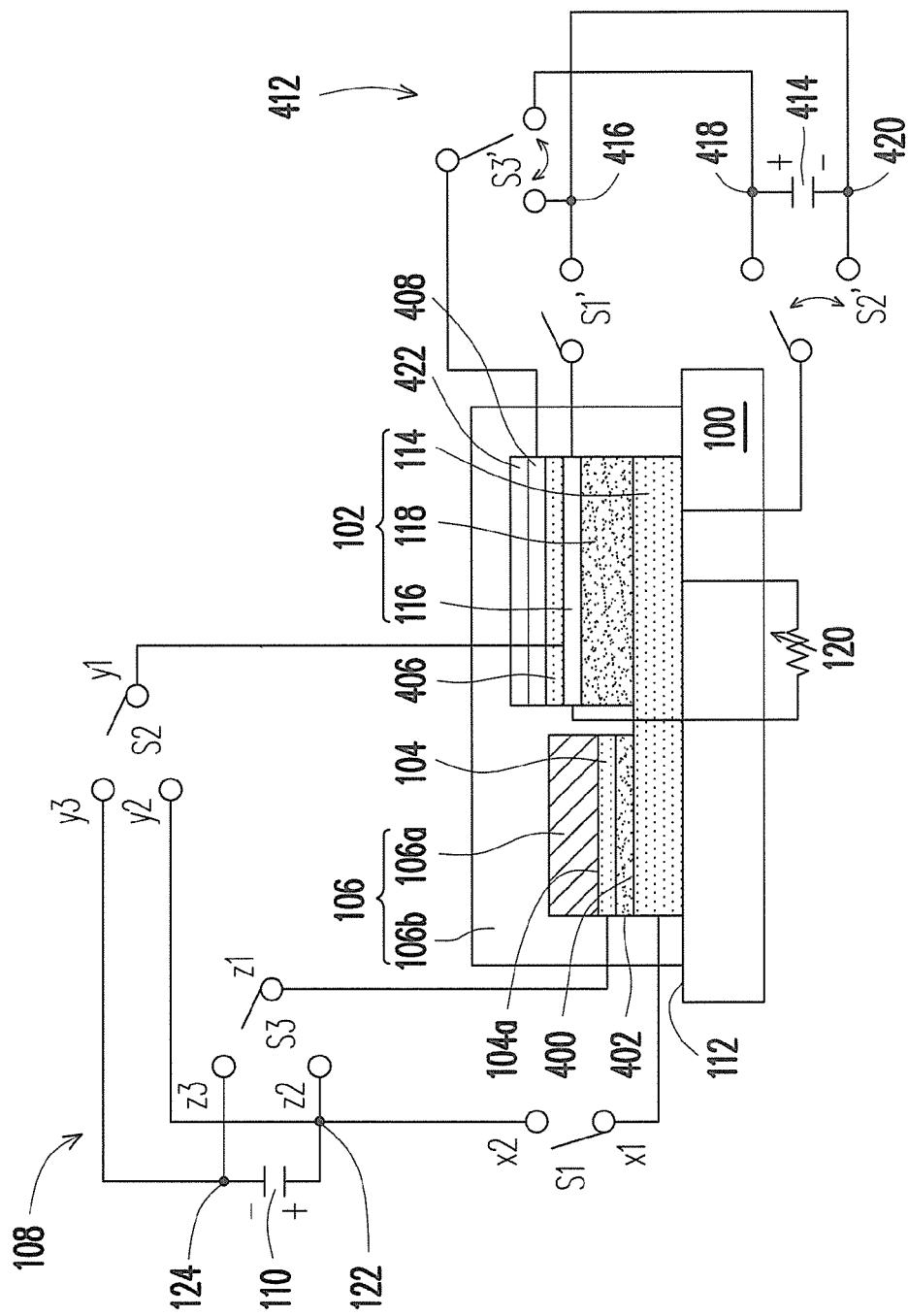

FIG. 4C is a schematic cross-sectional view illustrating still another tunable PV-EC device according to the second exemplary embodiment of the disclosure. It should be noted that the same reference numerals as shown in FIG. 4B are used herein to represent the same components. In FIG. 4C, an ion storage layer 422 is used to replace the second EC thin film 410 of FIG. 4B. Use of the ion storage layer 422 avails charge balance of the EC material 106 and increases the on/off switching times of the device. A material of the ion storage layer 422 is, for instance, a complementary polymeric EC material, such as poly(3,4-ethylenedioxy thiophene) (PEDOT), 3,4-propylenedioxythiophene (ProDOT), Viologen, or inorganic material ZnO, NiO, $V_2O_5$, $WO_3$, and so forth.

Since the devices described the above exemplary embodiments can be manufactured in form of modules, several exemplary embodiments are provided below to introduce various tunable PV-EC modules.

Figure 5A:
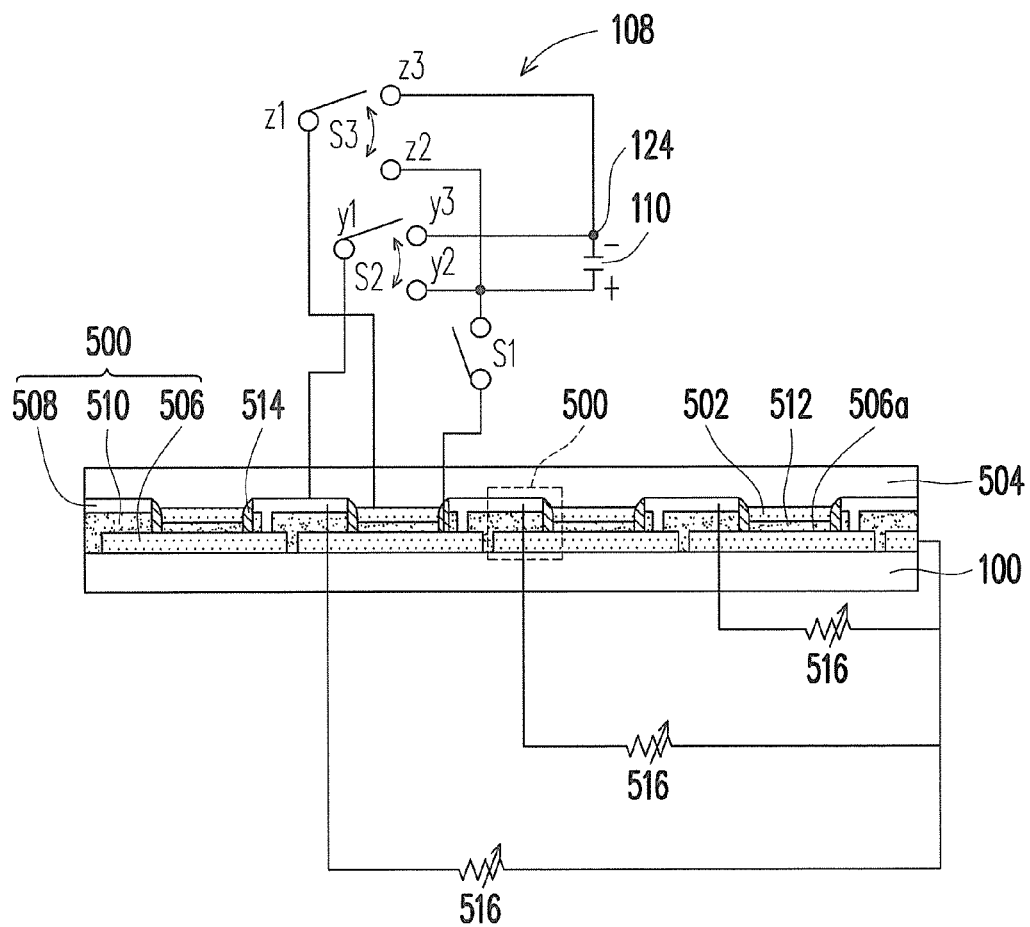
FIG. 5A to FIG. 5G are schematic cross-sectional views illustrating several tunable photovoltaic EC modules according to a third exemplary embodiment of the disclosure.

FIG. 5A is a schematic cross-sectional view illustrating a tunable PV-EC module according to a third exemplary embodiment of the disclosure. It should be noted that the same reference numerals as in the first embodiment are used herein to represent the same components.

With reference to FIG. 5A, the tunable PV-EC module of the third exemplary embodiment includes a transparent substrate 100, a plurality of thin film solar cells 500, a plurality of transparent conductive layers 502, solution type EC material 504, at least one switching apparatus 108, and at least one charge-discharge device 110. Each of the thin film solar cells 500 has an anode layer 506, a cathode layer 508, and a photoelectric conversion layer 510. In the third embodiment, the thin film solar cells 500 are connected in series. Hence, each anode layer 506 has an exposed surface 506a between the thin film solar cells 500, and each transparent conductive layer 502 is exposed between the thin film solar cells 500 to serve as the anode of the solution type EC material 504, at the same time the EC material 504 shares the same cathode layer 508. An insulation layer 512 is disposed between each anode layer 506 and each transparent conductive layer 502.

The solution type EC material 504 covers an exposed surface of each transparent conductive layer 502 and each thin film solar cell 500. At least one transparent conductive layer 502 and at least one thin film solar cell 500 covered with solution type EC material 504 can form a tunable PV-EC device. The switching apparatus 108 is electrically connected to the transparent conductive layer 502 and electrically connected to the anode layer 506 and the cathode layer 508 of the thin film solar cell 500 in the PV-EC device, so as to control the tunable PV-EC device. At this time, the transparent conductive layer 502 and the cathode layer 508 of the thin film solar cell 500 simultaneously serve as the anode and the cathode of the solution type EC material 504. The way to couple the switching apparatus 108 to the charge-discharge device 110 is the same as that described in the first exemplary embodiment. A set of external loop impedances applied in FIG. 5A refers to a plurality of common anode variable impedances 516. One end of each of the common anode variable impedances 516 is coupled to the anode layer 506 of one of the thin film solar cells 500, and the other end of each of the common anode variable impedances 516 is coupled to the cathode layer 508 of each of the thin film solar cells 500. Said circuit design leads to balanced charge distribution of each of the thin film solar cells 500 when the device changes color due to light irradiation, so as to ensure tint uniformity of the tunable PV-EC module having the serially connected structures. A passivation layer 514 can be further formed on sidewalls of the photoelectric conversion layer 510 in each of the thin film solar cells 500 for protecting the photoelectric conversion layer 510 from being damaged by the solution type EC material 504.

In the third exemplary embodiment, a composition of the solution type EC material is, for instance, an oxidation/reduction organic small molecule EC material, selected from a material group consisting of cathodic EC materials and anodic EC materials, or a combination thereof For instance, the cathodic EC material is methyl viologen, ethyl viologen, benzyl viologen, or propyl viologen; the anodic EC material is dimethyl-phenazine, phenylene diamine, N,N,N',N'-tetramethyl-1,4-phenylene-diamine (TMPD), and so on. Moreover, the composition of the above solution type EC material 504 further includes liquid electrolyte containing alkali metal salt and solvent. Here, the alkali metal salt is, for instance, lithium triflate, lithium perchlorate, or tetra alkyl ammonium salt; the solvent is, for instance, propylene carbonate, ethylene carbonate, γ-butyrolactone, acetonitrile, tetrahydrofuran (THF), or N-methyl-2-pyrrolidone (NMP). The solution type EC material 504 includes the suitably added polymer material for increasing viscosity of the EC solution, such as polyethylene oxide, polypropylene oxide, or polymethylmethacrylate.

Hence, the solution type EC material 504 in the third exemplary embodiment can replace the EC thin film 106a and the gel or solid electrolyte 106b described in the first or second embodiment.

Figure 5B:
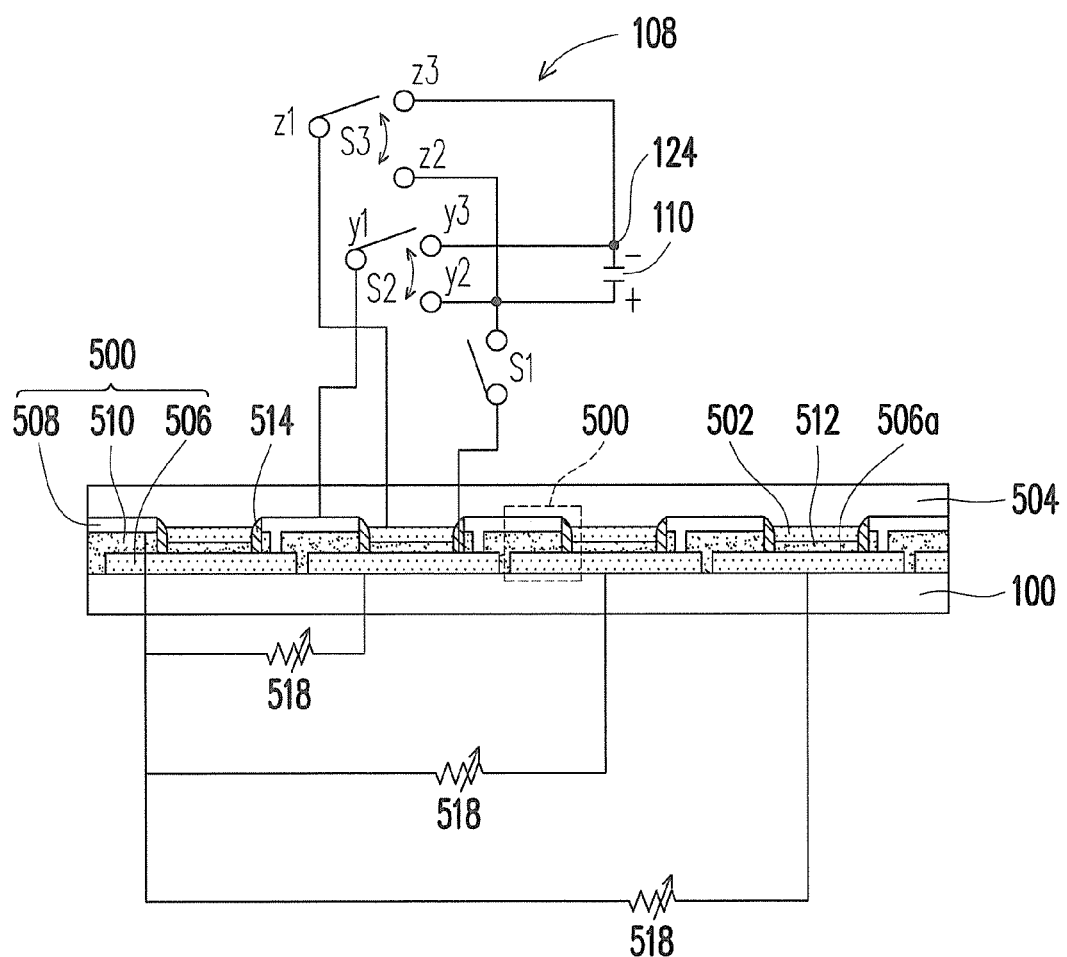

FIG. 5B is a schematic cross-sectional view illustrating another tunable PV-EC module according to the third exemplary embodiment of the disclosure. It should be noted that the same reference numerals as shown in FIG. 5A are used herein to represent the same components. A set of external loop impedances applied in FIG. 5B refers to a plurality of common cathode variable impedances 518. One end of each of the common cathode variable impedances 518 is coupled to the cathode layer 508 of one of the thin film solar cells 500, and the other end of each of the common cathode variable impedances 518 is coupled to anode layer 506 of each of the thin film solar cells 500. Said circuit design leads to balanced charge distribution of each of the thin film solar cells 500 when the device changes color due to light irradiation, so as to ensure tint uniformity of the tunable PV-EC module having the serially connected structures.

Figure 5C:
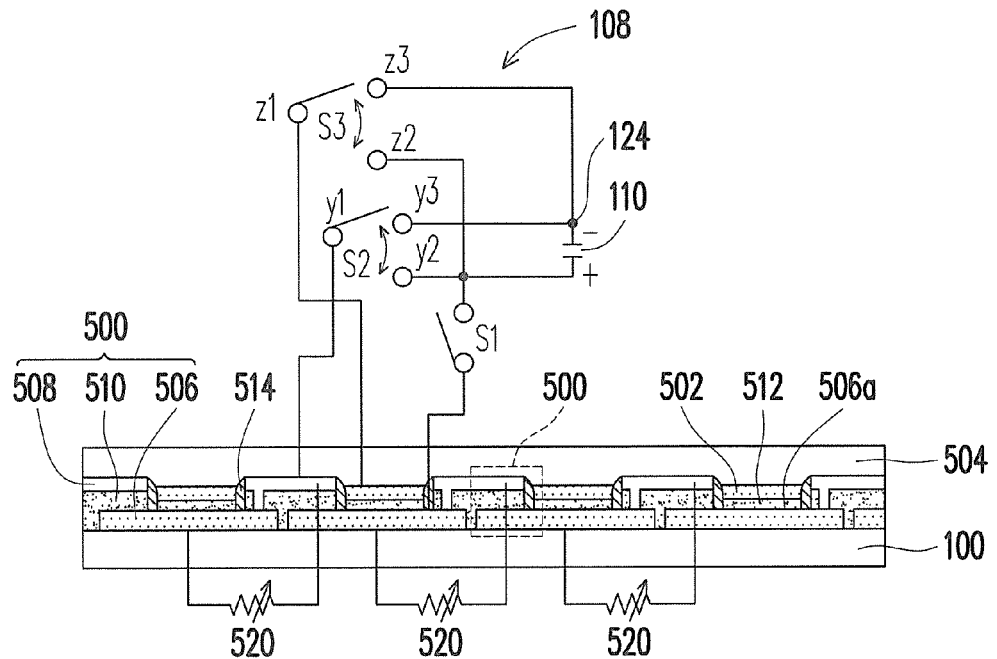

FIG. 5C is a schematic cross-sectional view illustrating still another tunable PV-EC module according to the third exemplary embodiment of the disclosure. It should be noted that the same reference numerals as shown in FIG. 5A are used herein to represent the same components. A set of external loop impedances applied in FIG. 5C refers to a plurality of serially connected variable impedances 520. One end of each of the serially connected variable impedances 520 is coupled to the anode layer 506 of one of the thin film solar cells 500, and the other end of each of the serially connected variable impedances 520 is coupled to the cathode layer 508 of another one of the thin film solar cells 500. All of the variable impedances 520 are connected in series. Said circuit design leads to balanced charge distribution of each of the thin film solar cells 500 when the device changes color due to light irradiation, so as to ensure tint uniformity of the serially connected tunable PV-EC devices.

Figure 5D:
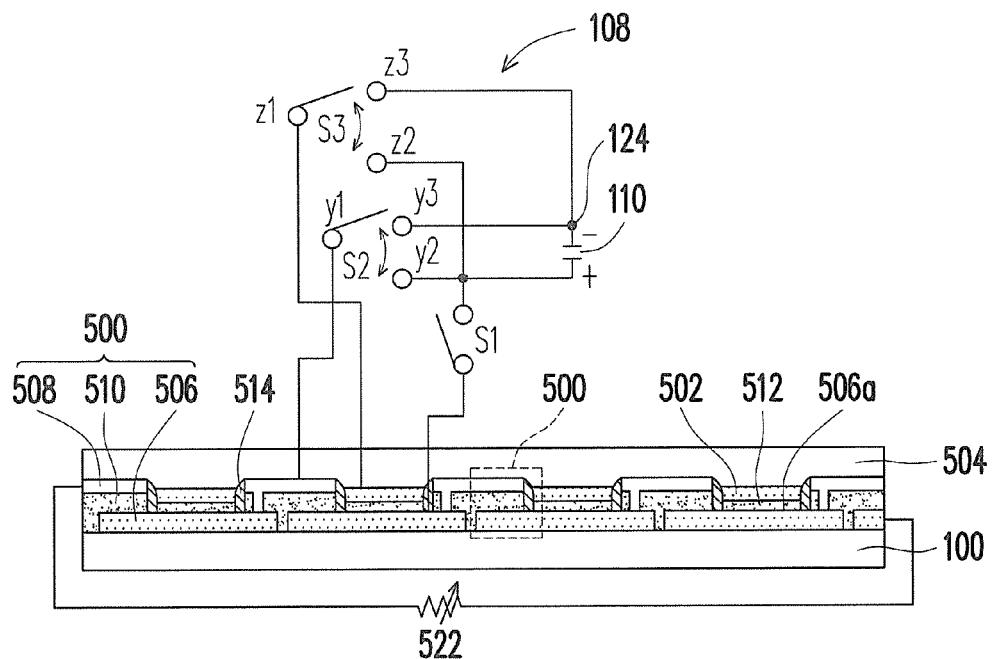

FIG. 5D is a schematic cross-sectional view illustrating still another tunable PV-EC module according to the third exemplary embodiment of the disclosure. It should be noted that the same reference numerals as shown in FIG. 5A are used herein to represent the same components. The external loop impedance applied in FIG. 5D refers to a head-to-tail connected variable impedance 522 that is coupled to the anode layer 506 of the thin film solar cell 500 at one edge and the cathode layer 508 of the thin film solar cell 500 at another edge. Said circuit design leads to balanced charge distribution of each of the thin film solar cells 500 when the device change color due to light irradiation, so as to have tint uniformity of the tunable PV-EC module in the serially connected structures.

Figure 5E:
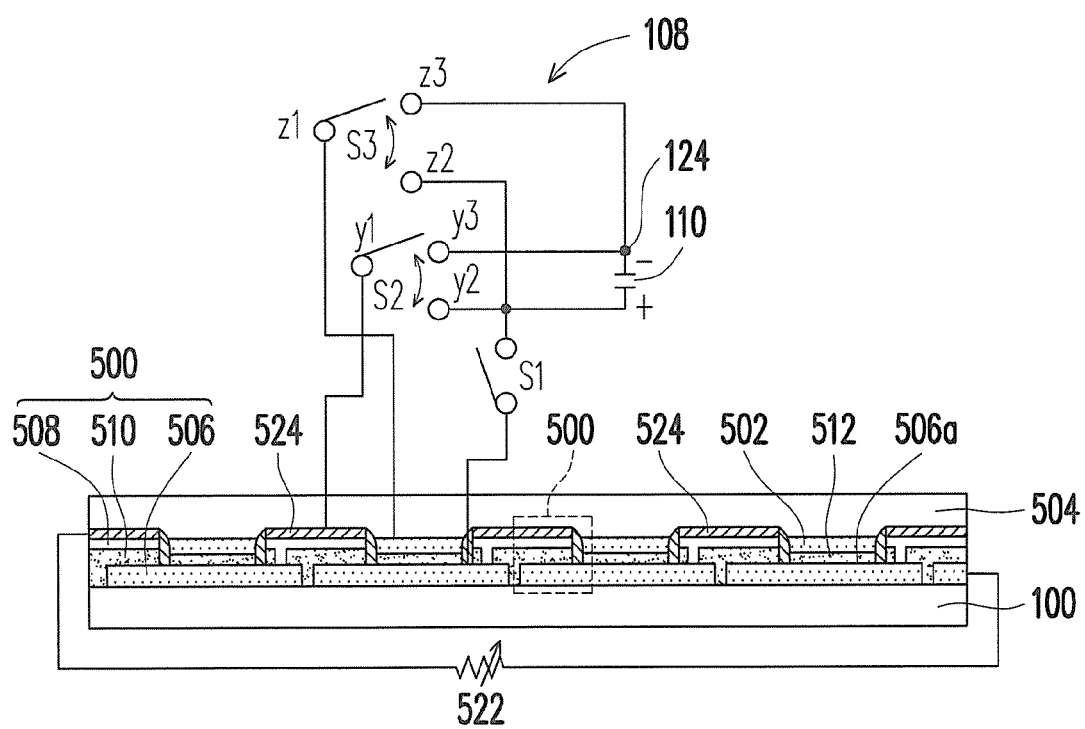

FIG. 5E is a schematic cross-sectional view illustrating another tunable PV-EC module according to the third exemplary embodiment of the disclosure. It should be noted that the same reference numerals as shown in FIG. 5D are used herein to represent the same components. In FIG. 5E, a photoresistor thin film 524 is located between a surface of the cathode layer 508 of each thin film solar cell 500 and the EC material 504. Therefore, the photoresistor thin films 524 with different impedances can be used to control the tint of the EC material 504, so as to achieve a color tint effect of the tunable PV-EC module of this exemplary embodiment.

Figure 5F:
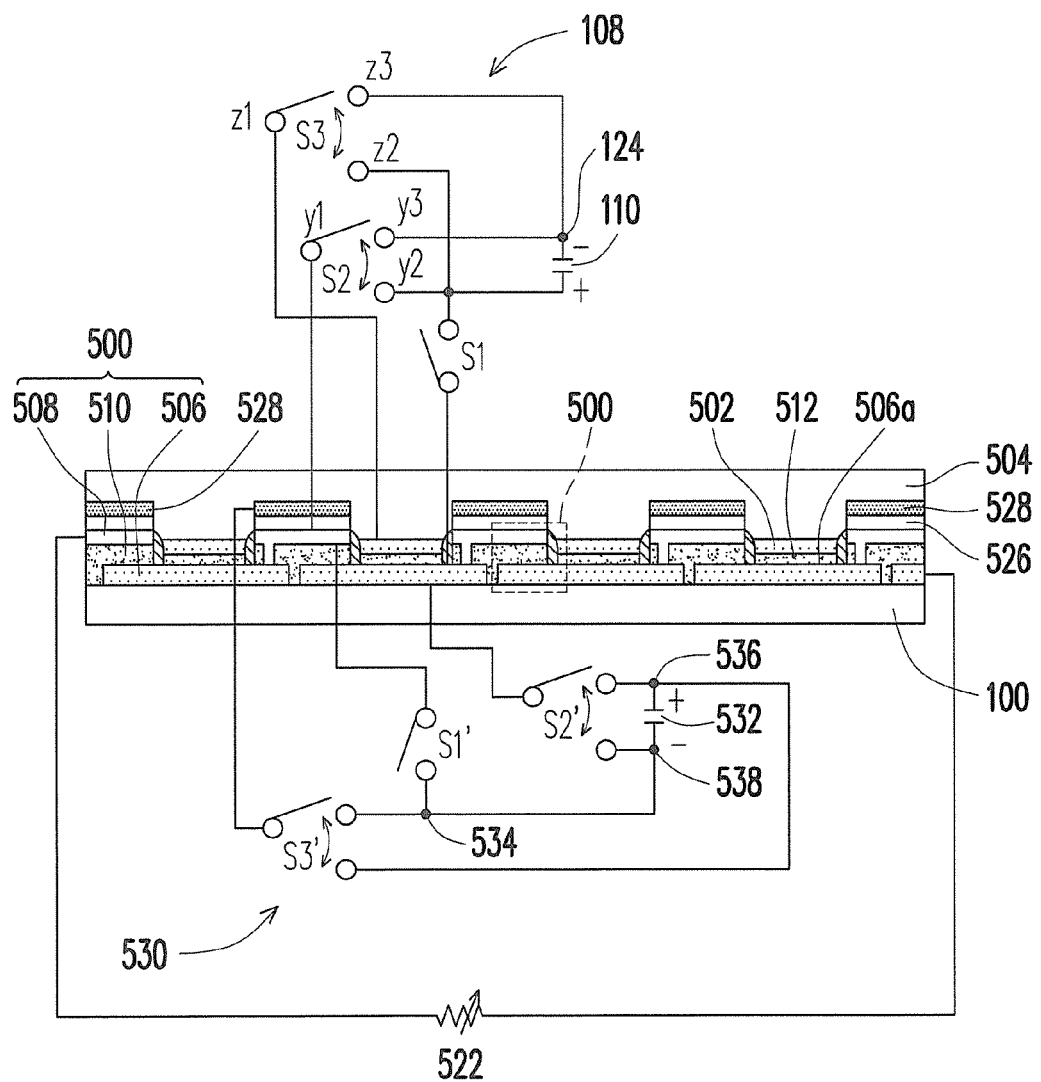

FIG. 5F is a schematic cross-sectional view illustrating still another tunable PV-EC module according to the third exemplary embodiment of the disclosure. It should be noted that the same reference numerals as shown in FIG. 5D are used herein to represent the same components. In FIG. 5F, a second insulation layer 526 is further configured on the cathode layer 508 of each thin film solar cell 500, and a second transparent conductive layer 528 is configured on the second insulation layer 526. At this time, the composition of the EC material 504 on the second transparent conductive layer 528, for instance, contains the cathode EC materials, and a second switching apparatus 530 and a second charge-discharge device 532 can be applied to adjust the color of the EC material 504 on the cathode layer 508. The second switching apparatus 530 is electrically connected to the second transparent conductive layer 528 and electrically connected to the anode layer 506 and the cathode layer 508 of each thin film solar cell 500. Besides, the second switching apparatus 530 enters the control modes through switch control signals. Therefore, the second transparent conductive layer 528 and the transparent conductive layer 502 serve as the cathode and the anode of the EC material 504.

In FIG. 5F, the second switching apparatus 530 has a first switch S1', a second switch S2', and a third switch S3', for instance. One end of the first switch S1' is coupled to the cathode layer 508, and the other end thereof is coupled to a first node 534. One end of the second switch S2' is coupled to the anode layer 506, and the other two ends thereof are respectively coupled to a second node 536 and a third node 538. One end of the third switch S3' is coupled to the second transparent conductive layer 528, and the other two ends thereof are respectively coupled to the first node 534 and the second node 536. The first node 534 and the third node 538 are connected. The anode and the cathode of the second charge-discharge device 532 are respectively coupled to the second node 536 and the third node 538.

Figure 5G:
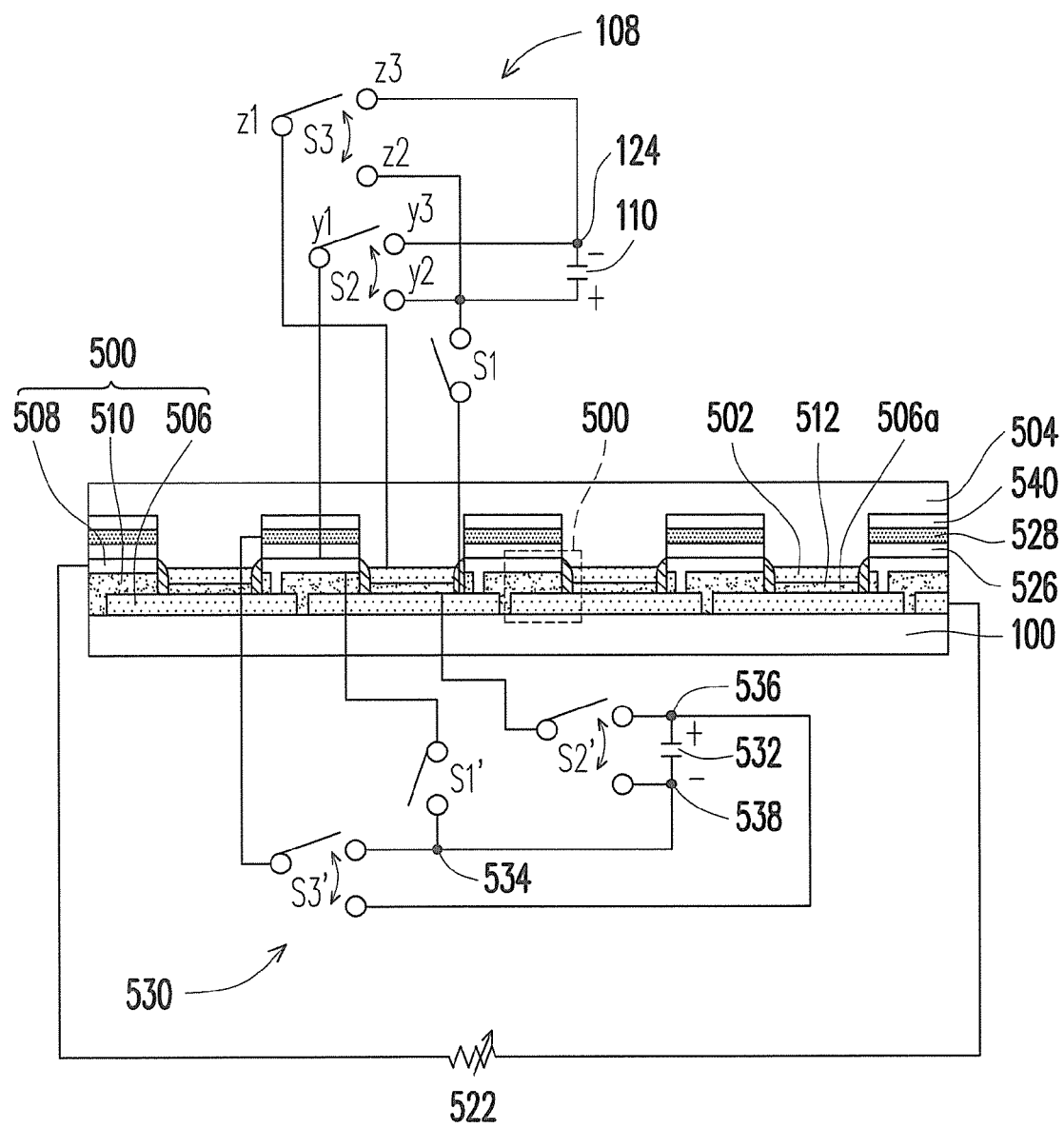

FIG. 5G is a schematic cross-sectional view illustrating still another tunable PV-EC module according to the third exemplary embodiment of the disclosure. It should be noted that the same reference numerals as shown in FIG. 5F are used herein to represent the same components. In FIG. 5G, an ion storage layer 540 is configured on a surface of the second transparent conductive layer 528, which avails charge balance of the EC material 504 and increases the on/off switching times of the device. The ion storage layer 540 can be referred to as that described in the second embodiment, and therefore detailed description thereof is not repeated. Therefore, the second transparent conductive layer 528 and the transparent conductive layer 502 simultaneously serve as the cathode and the anode of the EC material 504.

Figure 6:
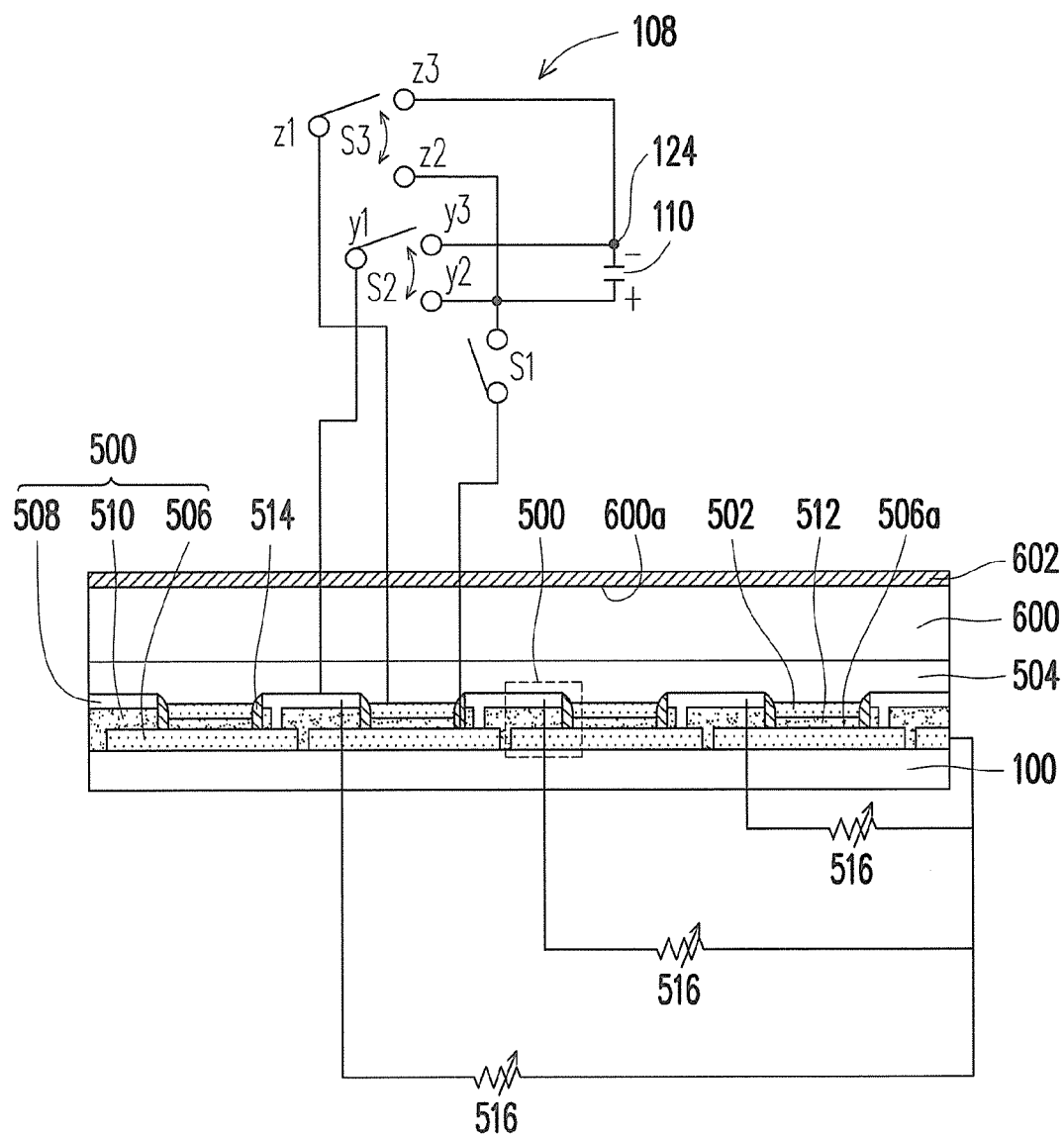
FIG. 6 is a schematic cross-sectional view illustrating a tunable photovoltaic EC module according to a fourth exemplary embodiment of the disclosure.

FIG. 6 is a schematic cross-sectional view illustrating a tunable PV-EC module according to a fourth exemplary embodiment of the disclosure. Same reference numerals as those described in the third embodiment are used to represent the same components.

With reference to FIG. 6, another transparent substrate 600 is configured opposite to the transparent substrate 100, and the thin film solar cells 500 and the solution type EC material 504 are configured between the transparent substrates 100 and 600. Here, the transparent substrate 600 is, for instance, a glass substrate, a plastic substrate, or a flexible substrate. A reflective film 602 can be formed on a surface 600a of the transparent substrate 600 to form a mirror surface, and the reflective film 602 is, for instance, a thin film coated with silver, aluminum, or chromium.

Figure 7:
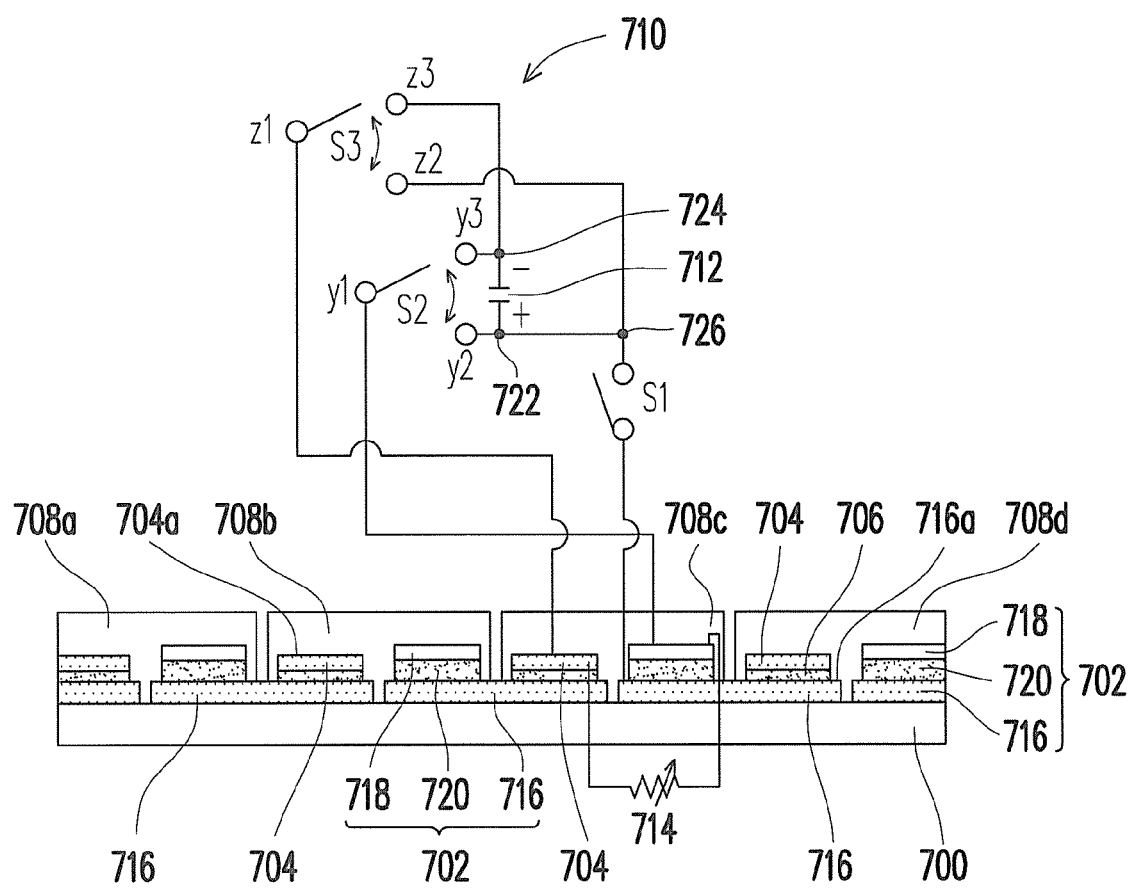
FIG. 7 is a schematic cross-sectional view illustrating a tunable photovoltaic EC module according to a fifth exemplary embodiment of the disclosure.

FIG. 7 is a schematic cross-sectional view illustrating a tunable PV-EC module according to a fifth exemplary embodiment of the disclosure.

With reference to FIG. 7, the tunable PV-EC module of the fifth exemplary embodiment includes a transparent substrate 700, a plurality of thin film solar cells 702, a plurality of transparent conductive layers 704, a plurality of insulation layers 706, a plurality of EC materials 708a~d, at least one switching apparatus 710, and at least one charge-discharge device 712. The thin film solar cell 702 is located on the transparent substrate 700, and each of the thin film solar cells 702 at least has an anode layer 716, a cathode layer 718, and a photoelectric conversion layer 720 between the anode layer 716 and the cathode layer 718. Each anode layer 716 has an exposed surface 716a exposed between the thin film solar cells 702. The transparent conductive layers 704 are respectively located on the exposed surface 716a of each anode layer 716, and the insulation layers 706 are respectively located between the anode layers 716 and the transparent conductive layers 704. The EC materials 708a~d respectively cover an exposed surface 704a of one of the transparent conductive layers 704 and one of the thin film solar cells 702. The EC materials 708a~d can be solution type, as described in the third exemplary embodiment. Moreover, each of the EC materials 708a~d which covers one of the transparent conductive layers 704 and one of the thin film solar cells 702 forms one single tunable PV-EC device.

In the fifth exemplary embodiment, the anode layer 716 located below the transparent conductive layer 704 under the EC material 708b is not connected to the anode layer 716 of the thin film solar cell 702 under the same EC material 708b. Therefore, the switching apparatus 710 is electrically connected to the transparent conductive layer 704 under the EC material 708c and the anode and the cathode layers 716 and 718 of the thin film solar cell 702 under the same EC material 708c. At this time, the transparent conductive layer 704 and the cathode layer 718 of the thin-film solar cell 702 respectively serve as the anode and the cathode of each of the EC materials 708a~d simultaneously. Moreover, a charge-discharge device 712 is coupled to the switching apparatus 710 for storing a current received from the thin film solar cell 702 and/or providing power to the transparent conductive layer 704. In addition, at least one set of external loop impedance 714 capable of tuning an impedance value is coupled between the transparent conductive layer 704 and the cathode layer 718 of the thin film solar cell 702, and in FIG. 7, though only one external loop impedance 714 is illustrated, the number of the external loop impedance 714 can be increased according to actual requirements.

According to the fifth exemplary embodiment, the anode and the cathode of the charge-discharge device 712 are respectively coupled to the switching apparatus 710 through a first node 722 and a second node 724, and the switching apparatus 710 has a first switch S1, a second switch S2, and a third switch S3, for instance. The first, second, and third switches S1, S2, and S3 are, for instance, transistor switches, mechanical switches, or light control switches. One end of the first switch S1 is coupled to the anode layer 716, and the other end thereof is coupled to a third node 726. One end of the second switch S2 is coupled to the cathode layer 718, and the other two ends thereof are respectively coupled to the first node 722 and the second node 724. One end of the third switch S3 is coupled to the transparent conductive layer 704, and the other two ends thereof are respectively coupled to the second node 724 and the third node 726. Accordingly, in the fifth exemplary embodiment, through the separate EC materials 708a~d, the anode layer 716 of the thin film solar cell 702 under the EC material 708b is connected to the anode layer 716 of the thin film solar cell 702 under the next EC material 708c.

Figure 8A:
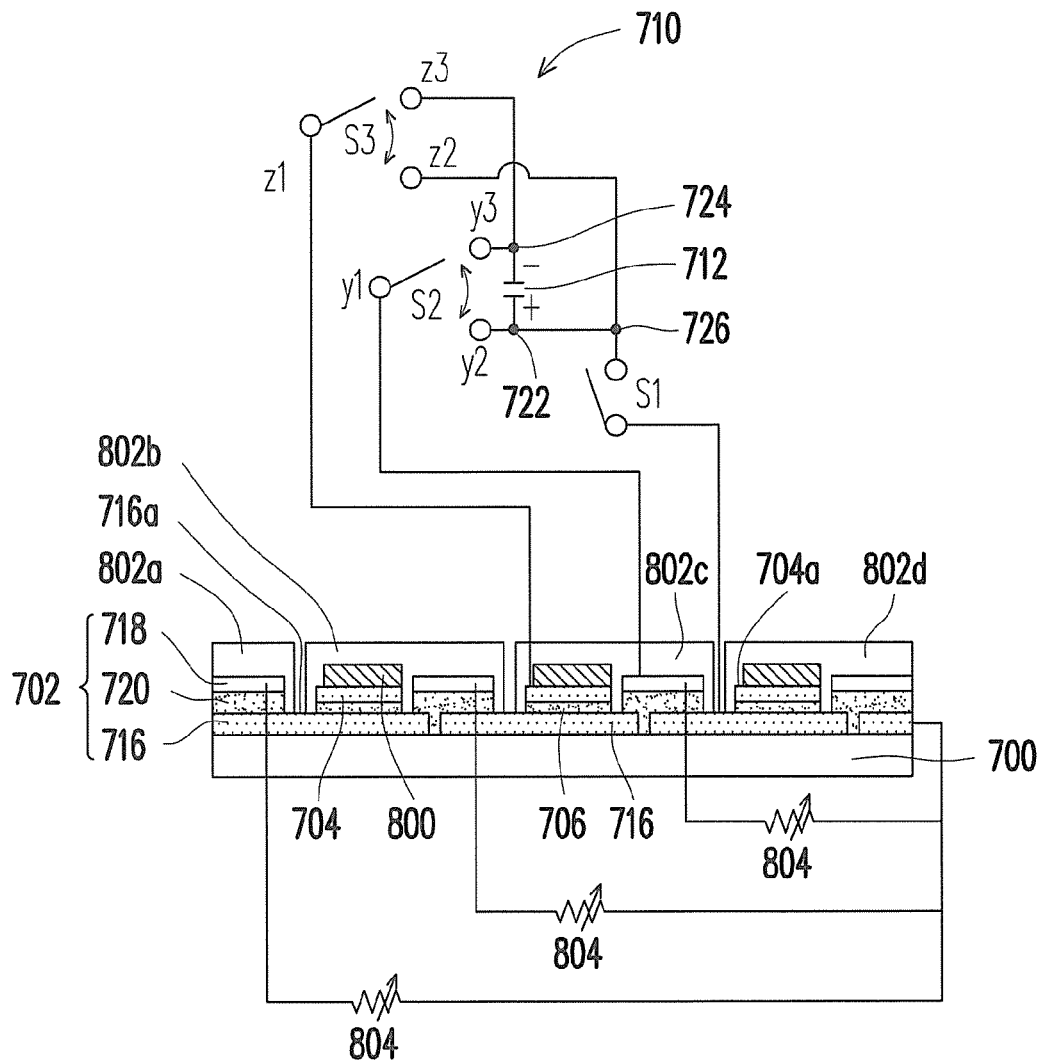
FIG. 8A and FIG. 8B are schematic cross-sectional views illustrating several tunable photovoltaic EC modules according to a sixth exemplary embodiment of the disclosure.

FIG. 8A is a schematic cross-sectional view illustrating a tunable PV-EC module according to a sixth exemplary embodiment of the disclosure. It should be noted that the same reference numerals as shown in FIG. 7 are used herein to represent the same components.

The circuitry applied in the sixth exemplary embodiment is similar to the circuitry applied in the module design of the fifth exemplary embodiment, and the main difference therebetween rests in that the EC material of the present exemplary embodiment includes the EC thin film (106a) and the gel or solid electrolyte (106b) similar to those depicted in FIG. 1, which is elaborated below.

With reference to FIG. 8A, an EC thin film 800 of the sixth exemplary embodiment is located on the exposed surface 704a of the transparent conductive layer 704, and each of the gel or solid electrolytes 802a~d respectively covers one of the EC thin films 800 and one of the thin film solar cells 702, to form one single PV-EC device. The EC thin films 800 and the gel or solid electrolytes 802a~d can be referred to as those described in the first exemplary embodiment, and the gel or solid electrolytes 802a~d of the present exemplary embodiment can also achieve a packaging effect. The external loop impedances 804 applied in FIG. 8A refer to a plurality of common anode variable impedances, for instance. One end of each of the common anode variable impedances 804 is coupled to the anode layer 716 of one of the thin film solar cells 702, and the other end of each of the common anode variable impedances 804 is coupled to the cathode layer 718 of each of the thin film solar cells 702. Certainly, the external loop impedance 804 of the sixth exemplary embodiment can also be any type of circuits shown in FIG. 5B and FIG. 5C.

In the sixth exemplary embodiment, the anode layer 716 located below the transparent conductive layer 704 under the gel or solid electrolyte 802b is not connected to the anode layer 716 of the thin film solar cell 802 under the same gel or solid electrolyte 802b. Namely, the switching apparatus 710 is electrically connected to the transparent conductive layer 704 under the gel or solid electrolyte 802c and the anode and the cathode layers 716 and 718 of the thin film solar cell 702 under the same gel or solid electrolyte 802c. At this time, the transparent conductive layer 704 and the cathode layer 718 of the thin film solar cell 702 simultaneously serve as the anode and the cathode of the EC material 800 under the electrolyte 802b. Moreover, a charge-discharge device 712 is coupled to the switching apparatus 710 for storing a current received from the thin film solar cell 702 and/or providing power to the transparent conductive layer 704.

Figure 8B:
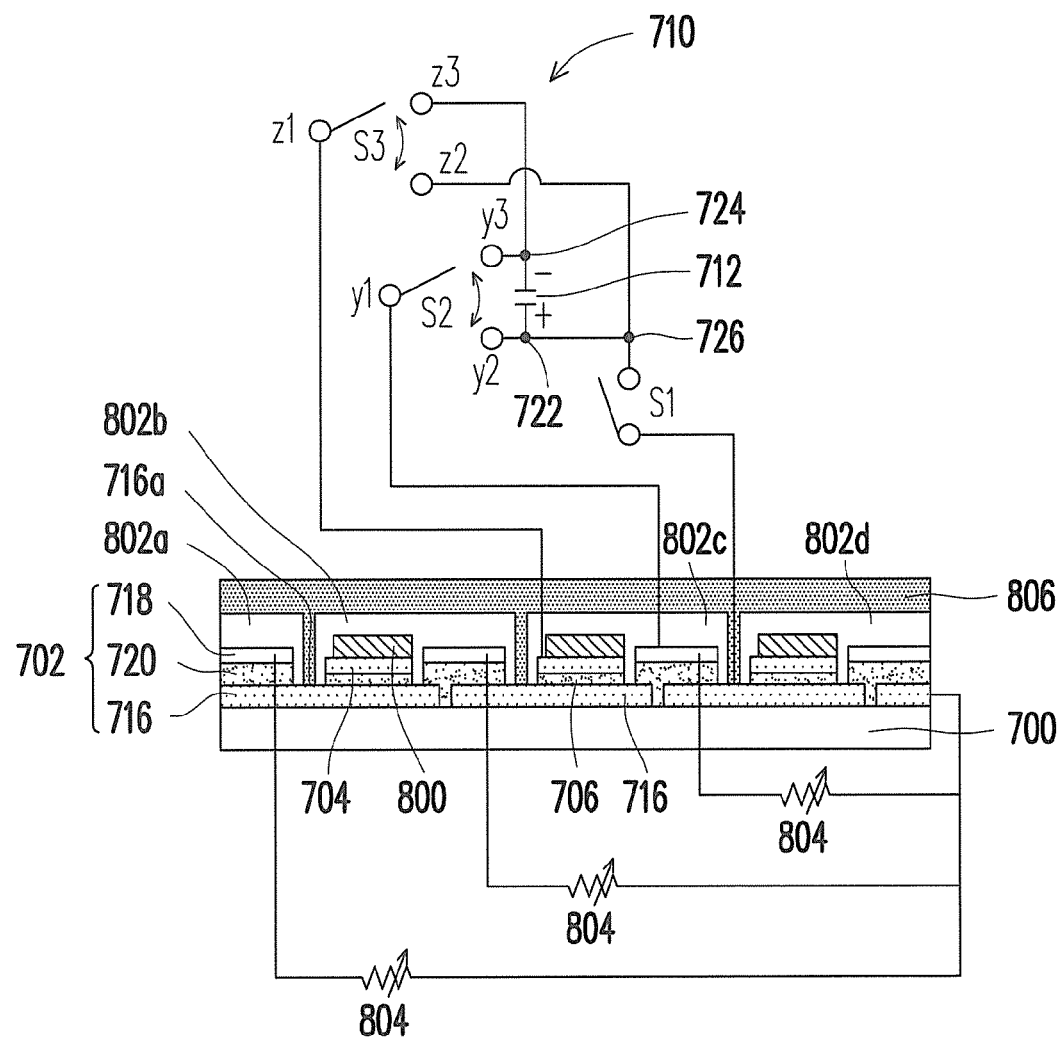

FIG. 8B is a schematic cross-sectional view illustrating another tunable PV-EC module according to the sixth exemplary embodiment of the disclosure.

It should be noted that the same reference numerals as shown in FIG. 8A are used herein to represent the same components. In FIG. 8B, it is assumed that the gel or solid electrolytes 802*a~d* do not achieve the packaging effect, and thus a packaging material 806 can be added on the transparent substrate 700. The other components in the structure shown in FIG. 8A are applicable in FIG. 8B.

Figure 9:
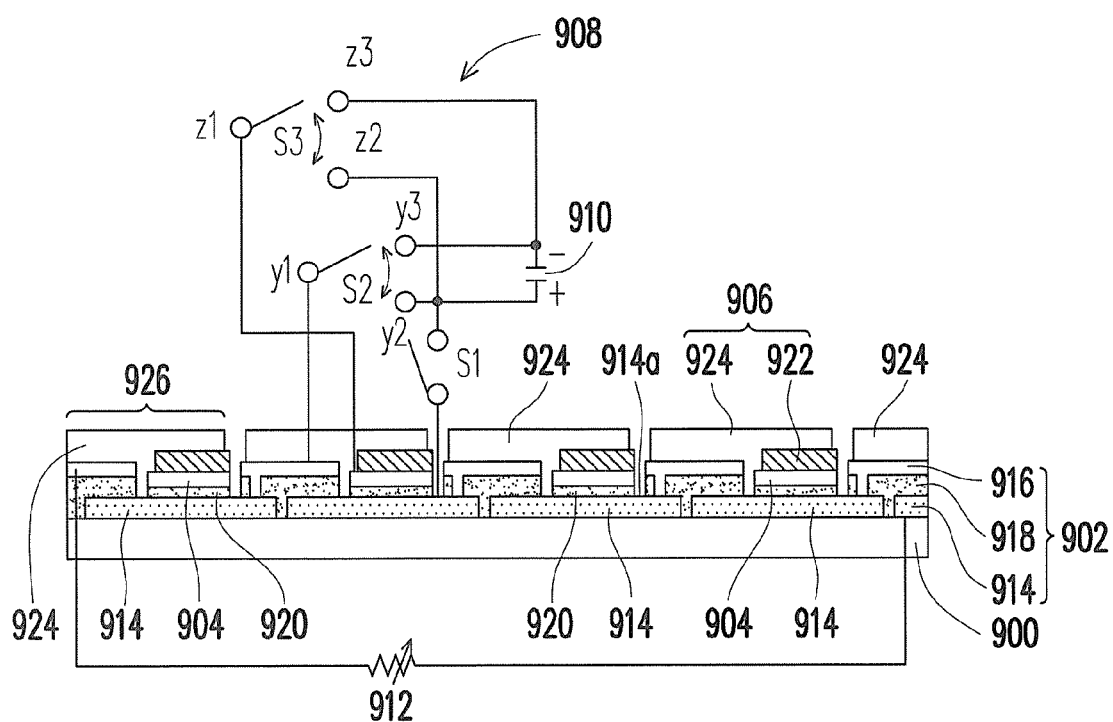
FIG. 9 is a schematic cross-sectional view illustrating a tunable photovoltaic EC module according to a seventh exemplary embodiment of the disclosure.

FIG. 9 is a schematic cross-sectional view illustrating a tunable PV-EC module according to a seventh exemplary embodiment of the disclosure.

With reference to FIG. 9, the tunable PV-EC module of the seventh exemplary embodiment includes a transparent substrate 900, a plurality of thin film solar cells 902, a plurality of transparent conductive layers 904, a plurality of EC materials 906, at least one switching apparatus 908, and at least one charge-discharge device 910. Each of the thin film solar cells 902 is located on the transparent substrate 900 and has an anode layer 914, a cathode layer 916, and a photoelectric conversion layer 918. The transparent conductive layers 904 are also located on the transparent substrate 900 and exposed between the thin film solar cells 902. For instance, the anode layer 914 of each of the thin film solar cells 902 has an exposed surface 914*a* that is exposed between the thin film solar cells 902, such that the transparent conductive layer 904 is located over the exposed surface 914*a* and is isolated from the anode layer 914 by an isolation layer 920. The EC materials 906 are the same as the EC material 106 of the first exemplary embodiment. Specifically, each of the EC materials 906 includes an EC thin film 922 and a gel or solid electrolyte 924 that covers at least the EC thin film 922 and the cathode layer 916 of the thin film solar cell 902. In the seventh exemplary embodiment, one of the transparent conductive layers 904, one of the EC thin films 922, and one of the thin film solar cells 902 which three are all covered by the one of the gel or solid electrolytes 924 form one single tunable PV-EC device 926. The gel or solid electrolytes 924 in the tunable PV-EC devices 926 are not connected. Moreover, at least one set of external loop impedance 912 capable of tuning an impedance value (e.g., the head-to-tail connected variable impedance of FIG. 5D) can be coupled to the anode layer 914 of the thin film solar cell 902 at one edge and the cathode layer 916 of the thin film solar cell 902 at another edge. Certainly, any type of the external loop impedance shown in FIG. 5A to FIG. 5C is applicable in the present exemplary embodiment according to an actual requirement.

Since the gel or solid electrolyte 924 individually exists in each of the tunable PV-EC devices 926, the problem of charge imbalance can be significantly mitigated, so as to prevent the problem of uneven color change during light irradiation. The switching apparatus 908 is electrically connected to the transparent conductive layer 904 and electrically connected to the anode layer 914 and the cathode layer 916 of the thin film solar cell 902 in the tunable PV-EC device 926, so as to control the tunable PV-EC device 926. The way to couple the switching apparatus 908 to the charge-discharge device 910 is the same as the way described in the first exemplary embodiment, and the charge-discharge device 910 is, for instance, a capacitor or a battery. At this time, the transparent conductive layers 904 and the cathode layers 916 of the thin-film solar cells 902 respectively serve as the anodes and the cathodes of the EC materials 906 simultaneously.

Figure 10A:
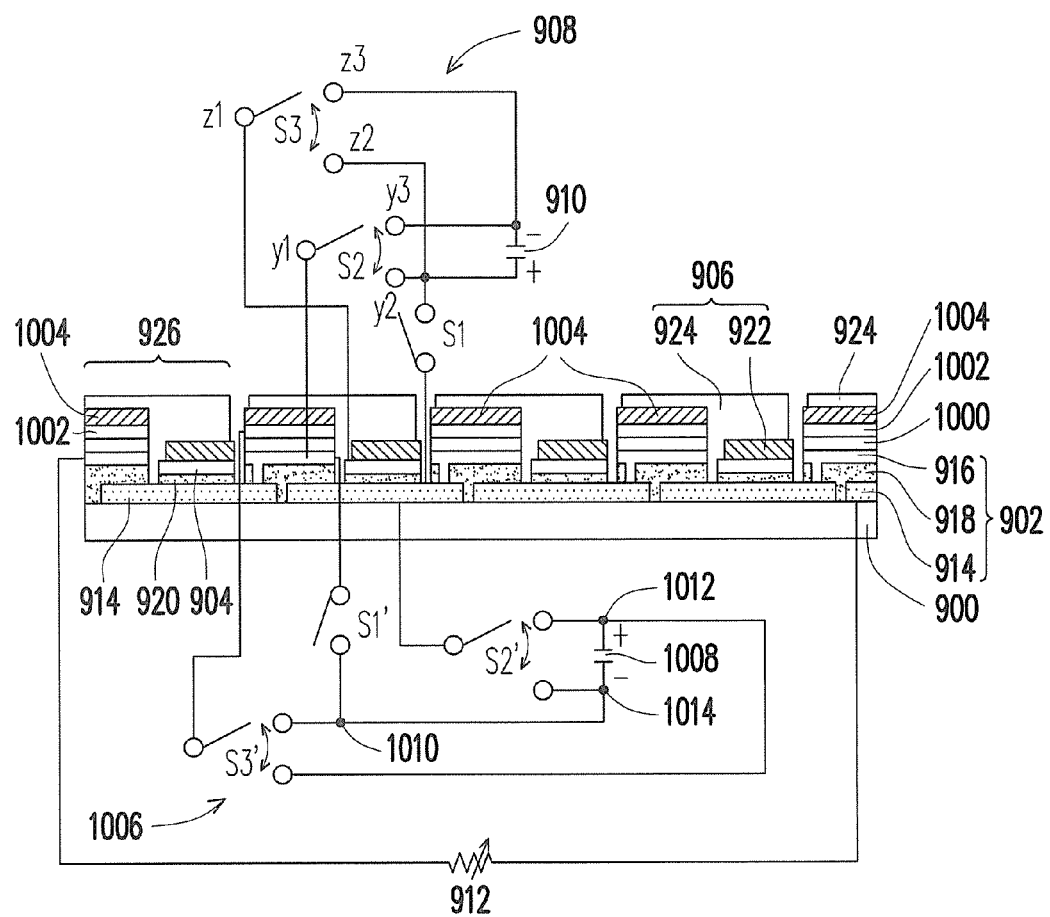
FIG. 10A and FIG. 10B are cross-sectional views illustrating two other modules according to the seventh exemplary embodiment of the disclosure.

FIG. 10A is a schematic cross-sectional view illustrating another tunable PV-EC module according to the seventh exemplary embodiment of the disclosure. It should be noted that the same reference numerals as shown in FIG. 9 are used herein to represent the same components. As shown in FIG. 10A in addition to the EC material 906 covering the transparent conductive layer 904 and the thin film solar cell 902, the tunable PV-EC device 926 further includes another insulation layer 1000 formed on a surface of the cathode layer 916 of the thin film solar cell 902, and a transparent conductive layer 1002 is further formed on the insulation layer 1000. An EC thin film 1004 (e.g., the cathode EC thin film) is formed on the transparent conductive layer 1002, and a switching apparatus 1006 and a charge-discharge device 1008 are employed to adjust the color of the EC material 906 on the cathode layer 916. The switching apparatus 1006 is electrically connected to the transparent conductive layer 1002 and electrically connected to the anode layer 914 and the cathode layer 916 of each thin film solar cell 902. Besides, the switching apparatus 1006 enters the control modes through switch control signals. Therefore, the transparent conductive layer 1002 and the transparent conductive layer 904 simultaneously serve as the cathode and the anode of the EC material 906. In addition, it is likely to form the EC thin film 1004 on the transparent conductive layer 1002 without forming the EC thin film 922 on the transparent conductive layer 904. At this time, the gel or solid electrolyte 924 directly covers the transparent conductive layer 904 and the EC thin film 1004.

In FIG. 10A, the switching apparatus 1006 has a first switch S1', a second switch S2', and a third switch S3', for instance. One end of the first switch S1' is coupled to the cathode layer 916, and the other end thereof is coupled to a first node 1010. One end of the second switch S2' is coupled to the anode layer 914, and the other two ends thereof are respectively coupled to a second node 1012 and a third node 1014. One end of the third switch S3' is coupled to the transparent conductive layer 1002, and the other two ends thereof are respectively coupled to the first node 1010 and the second node 1012. The first node 1010 and the third node 1014 are connected. The anode and the cathode of the charge-discharge device 1008 are respectively coupled to the second node 1012 and the third node 1014.

Figure 10B:
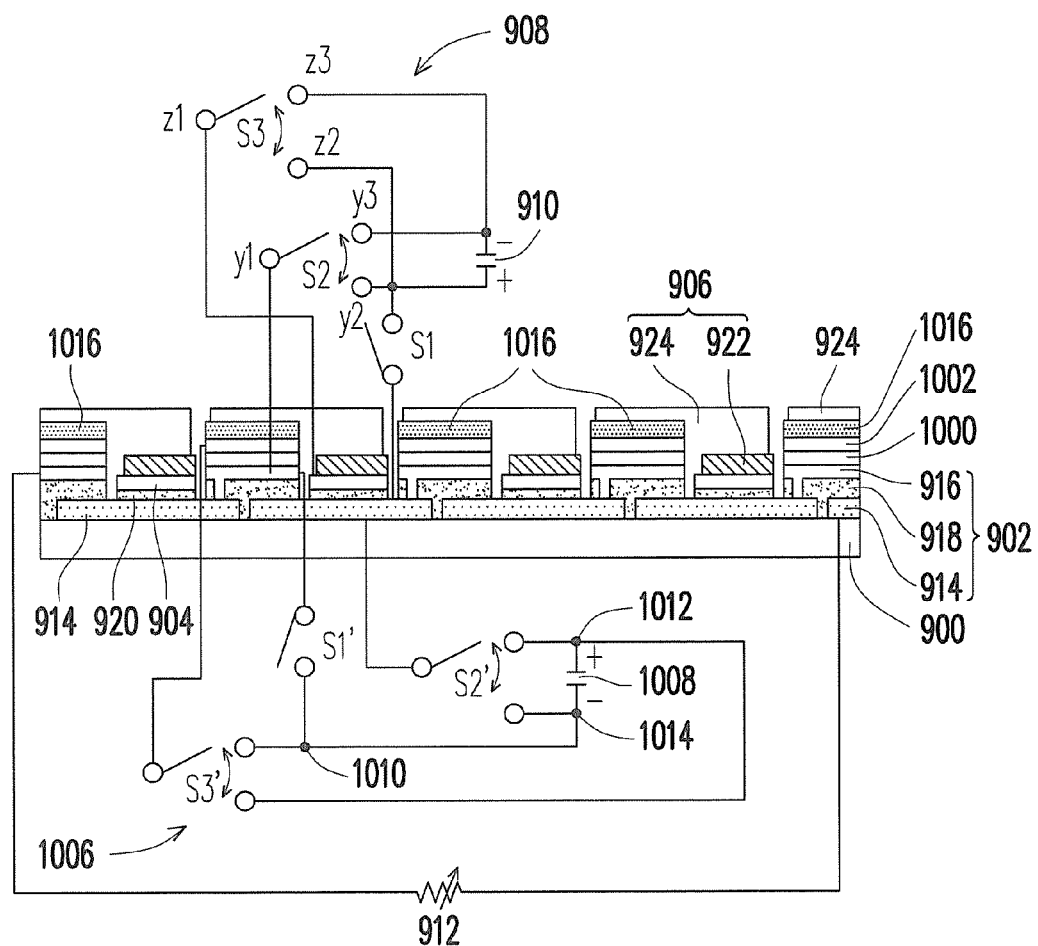

FIG. 10B is a schematic cross-sectional view illustrating still another tunable PV-EC module according to the seventh exemplary embodiment of the disclosure. It should be noted that the same reference numerals as shown in FIG. 10A are used herein to represent the same components. In FIG. 10B, an ion storage layer 1016 is applied to replace the cathode EC thin film 1004 depicted in FIG. 10A. Use of the ion storage layer 1016 avails charge balance of the EC material 906 and increases the on/off switching times of the device. Therefore, the transparent conductive layer 1002 and the transparent conductive layer 904 simultaneously serve as the cathode and the anode of the EC material 906. A material of the ion storage layer 1016 is, for instance, a complementary EC material, such as PEDOT, ProDOT, Viologen, or inorganic material ZnO, NiO, $V_2O_5$, $WO_3$, and so on.

Figure 11:
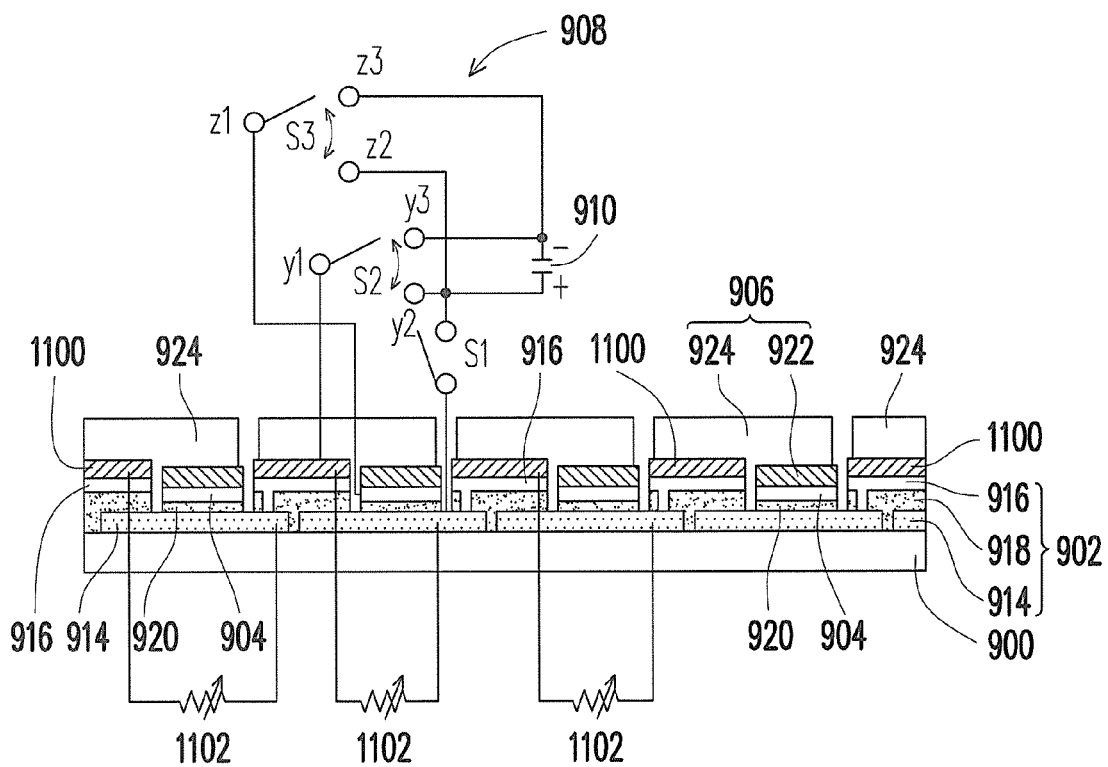
FIG. 11 is a schematic cross-sectional view illustrating a tunable photovoltaic EC module according to an eighth exemplary embodiment of the disclosure.

FIG. 11 is a schematic cross-sectional view illustrating a tunable PV-EC module according to an eighth exemplary embodiment of the disclosure. It should be noted that the same reference numerals as in the seventh embodiment are used herein to represent the same components. With reference to FIG. 11, the difference between the tunable PV-EC module described in the eighth exemplary embodiment and that described in the seventh exemplary embodiment lies in that a photoresistor thin film 1100 can be configured between the cathode layer 916 of each thin film solar cell 902 and the gel or solid electrolyte 924. Therefore, the photoresistor thin films 1100 with different impedances can be used to control tint of the EC materials 906, so as to achieve a color tint effect of the tunable PV-EC module of this exemplary embodiment. Moreover, the external loop impedances 1102 shown in FIG. 11 are, for instance, the serially connected variable impedances depicted in FIG. 5C. Certainly, any type of the external loop impedance shown in FIG. 5A, FIG. 5B, or FIG. 5D can be applied in this exemplary embodiment based on an actual requirement.

For the case, the electrolyte or the EC material is designed to be in discontinuous-stripe shaped, the external loop impedances in the modules shown in FIG. 7 to FIG. 11 may be omitted.

Figure 12A:
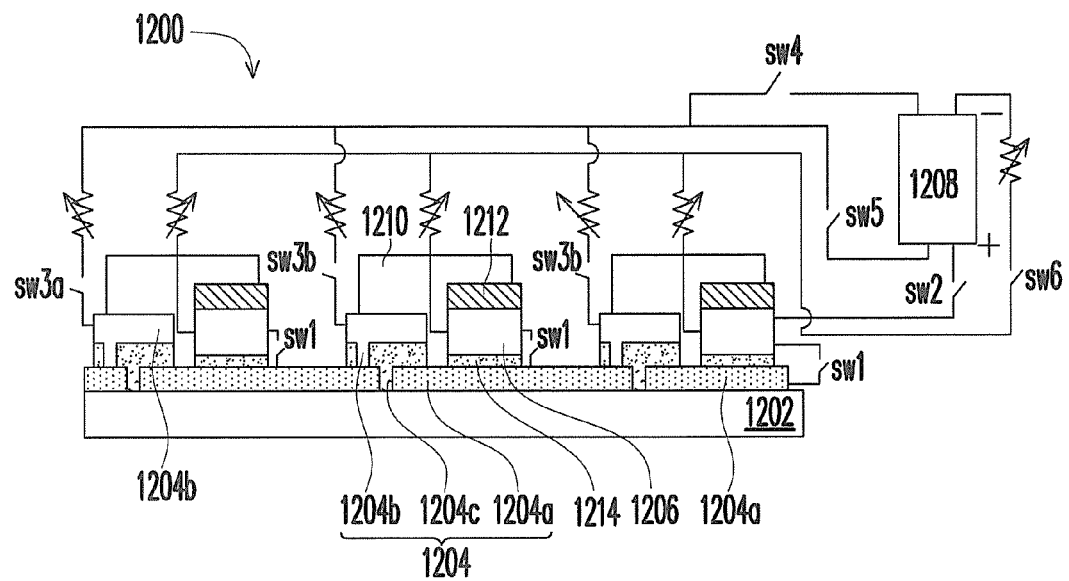
FIG. 12A and FIG. 12B are schematic cross-sectional views illustrating two tunable photovoltaic EC modules according to a ninth exemplary embodiment of the disclosure.
Figure 12B:
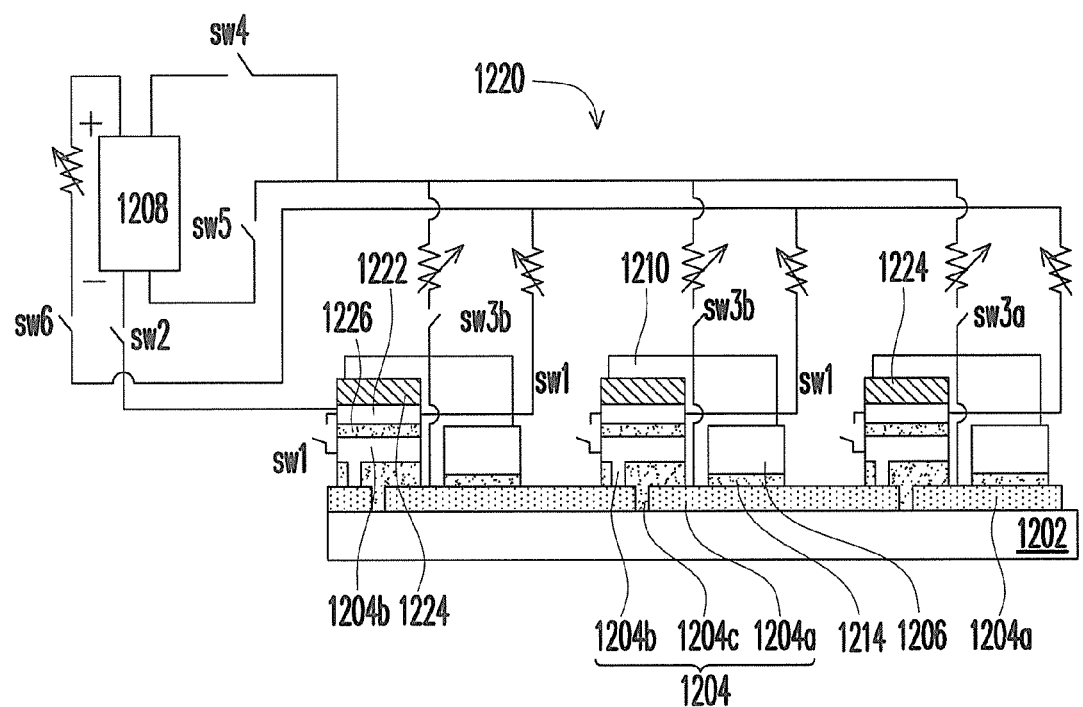

FIG. 12A and FIG. 12B are schematic cross-sectional views illustrating two tunable PV-EC modules according to a ninth exemplary embodiment of the disclosure.

With reference to FIG. 12A, the tunable PV-EC module 1200 described in the ninth exemplary embodiment includes a transparent substrate 1202, the serially connected thin film solar cells 1204 (including anode layers 1204a, cathode layers 1204b, and photoelectric conversion layers 1204c), first transparent conductive layers 1206, a first switching apparatus, a charge-discharge device 1208, solid electrolytes 1210, and EC thin films 1212. Insulation layers 1214 are generally configured between the anode layers 1204a and the transparent conductive layers 1206.

As indicated in FIG. 12A, the first switching apparatus is a circuit controlling apparatus that contains a plurality of switches respectively connected to the transparent conductive layers 1206, the anode layers 1204a and the cathode layers 1204b of the thin film solar cells 1204. When the tunable PV-EC module is irradiated by light, the switches sw1 of the first switching apparatus are switched on, so as to change the color of the EC thin films 1212. The switches sw2, sw3a, and sw4 are also switched on, so as to store electricity generated by the thin film solar cell module 1200 into the charge-discharge device 1208. The electricity storage mechanism described in the ninth exemplary embodiment is similar to that in a conventional thin film solar cell module. Namely, by switching on the switches sw3a and sw4, the cathode 1204b on one edge of the serially connected thin film solar cells 1204 can be connected to the charge-discharge device 1208; by switching on the switches sw1 and sw2, the anode 1204a on the other edge of the serially connected thin film solar cells 1204 can be connected to the charge-discharge device 1208 as well. To bleach the tunable PV-EC module 1200, the single charge-discharge device 1208 needs to be conducted by switching on sw5, sw3a and each sw3b to connect each cathode 1204b, and by switching on sw6 to connect each transparent conductive layer 1206, so as to provide a reverse potential and current. According to the ninth exemplary embodiment, the tunable PV-EC module 1200 can be bleached with only one single charge-discharge device 1208 that provides a reverse potential and current to each of the single PV-EC device. Hence, the cathode layer 1204b of each thin film solar cell and each transparent conductive layer 1206 can be protected by interconnection to variable impedances.

In FIG. 12B, another tunable PV-EC module 1220 is shown, and the difference between the tunable PV-EC module 1220 in FIG. 12B and the tunable PV-EC module 1200 in FIG. 12A lies in that a transparent conductive layer 1222 can be further formed on the cathode layer 1204b of the thin film solar cell 1204. An EC thin film 1224 (e.g., the cathode EC thin film) is formed on the transparent conductive layer 1222, and an insulation layer 1226 is often configured between the cathode layer 1204b and the transparent conductive layer 1222. A switching apparatus and a charge-discharge device 1208 are employed to adjust the color of the EC thin film 1224 on the cathode layer 1204b.

The solid electrolyte 1210 and the EC thin films 1212 and 1224 in the ninth exemplary embodiment can be replaced by solution type EC material (e.g., the solution type EC material 504 shown in FIG. 5A). Additionally, the thin film solar cell modules 1200 and 1220 respectively depicted in FIG. 12A and FIG. 12B can further have the EC materials, the ion storage layers, or the photoresistor thin films based on the descriptions in the previous exemplary embodiments, and thus further explanations are omitted herein.

According to the previous exemplary embodiments, the electricity generated by the thin film solar cell is converted to chemical energy to drive the EC system (the transparent conductive layer and the EC material) to change color. The color changing mechanism relies on the normal electrochemical redox reaction, and coloration or color bleach is controlled by the switch control signals of a switching apparatus. The same principle and device structure is applicable to a battery, an electrochemical capacitor, or a super capacitor.

Several experiments are provided below to verify the effects of the disclosure, and in the following experiments, a silicon thin film solar cell is taken as an example.

First Experiment

Figure 13:
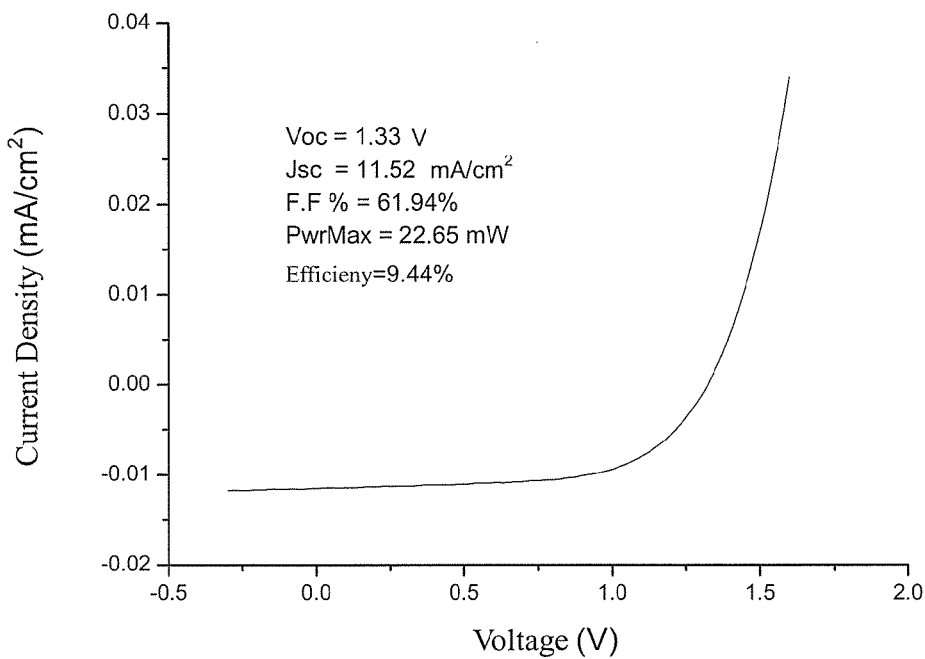
FIG. 13 is an I-V curve diagram illustrating the characteristics of photoelectric conversion of a silicon thin film solar cell according to a first experiment.

In the first experiment, the on/off switching circuitry of the tunable PV-EC device is inspected. A first transparent glass substrate of 1 cm×4 cm is prepared, and a single set of silicon thin film solar cell is formed thereon. Here, an anode area and a cathode area of the silicon thin film solar cell are respectively 0.5 cm×4 cm. An I-V curve of the silicon thin film solar cell is shown in FIG. 13, wherein Voc=1.33 volts, Jsc=11.52 mA/cm$^2$, F.F %=61.94%, PwrMax=22.65 mW, and power generating efficiency=9.44%.

A laser with a wavelength of 355 nm is employed to peel off a portion of an exposed area of the anode of the silicon thin film solar cell, so as to isolate most of the anode area and form the transparent conductive layer depicted in FIG. 1. A Prussian blue thin film is then formed on the surface of the isolated transparent conductive layer. The circuit of the switching apparatus shown in FIG. 1 is formed on a circuit board, and the switching apparatus is coupled to a capacitor. The anode and the cathode of the silicon thin film solar cell and the transparent conductive layer are respectively connected to the above circuit board. Based on said circuit design, the Prussian blue thin film on the surface of the transparent conductive layer can be colored or bleached electrochromically through light irradiation, which can be controlled by the switching apparatus.

The silicon thin film solar cell is placed into a 0.1M LiClO$_4$/DI-water electrolytic solution, and a control mode of the switching apparatus is set to the charging-EC mode with power supplied by the silicon thin film solar cell.

Figure 14:
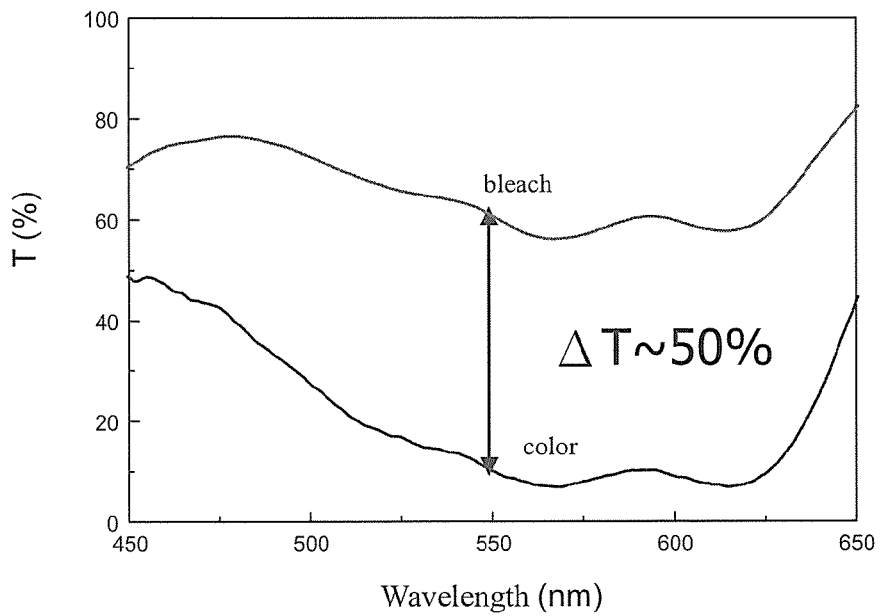
FIG. 14 is a spectrum diagram illustrating that a Prussian blue thin film is colored or bleached according to a second experiment.

When sunlight irradiates the above device, within ten seconds, the Prussian blue thin film on the surface of the transparent conductive layer starts to change color, i.e., gradually from transparent colorless to light blue. The control mode of the switching apparatus is then set to the bleaching mode, and it can be observed that the Prussian blue thin film on the transparent conductive layer is gradually changed from light blue to transparent colorless within three seconds. Thereby, it is proven that the reverse potential applied to the EC thin film from the capacitor leads to the bleaching effect. The optical contrast of coloring and bleaching of the Prussian blue thin film through light irradiation is shown in FIG. 14.

Second Experiment

In the second experiment, surfaces of the silicon thin film solar cells in a tunable PV-EC module are mutually contacted through a continuous solid electrolyte.

A transparent glass substrate of 3 m×4 cm is prepared, and three sets of silicon thin film solar cells connected in series are formed thereon. An anode area and a cathode area of each set of the silicon thin film solar cell are respectively 0.5 cm×4 cm, and the anode is exposed between the cathodes. Photoelectric conversion features of the silicon thin film solar cell module are as follows: Voc=3.98 volts, Isc=27.84 mA/cm$^2$, F.F %=67.31%, PwrMax=74.67 mW, and power generating efficiency of the module=5.66%. (The power generating efficiency of the module is calculated based on the actual area where electricity is generated.)

A SiN$_x$ thin film, an ITO thin film, and a Prussian blue thin film are sequentially formed on the anode exposed between the silicon thin film solar cells. Here, a peripheral portion of the anode of the silicon thin film solar cell is designed to be exposed from the SiN$_x$ thin film, and said design can achieve an effect that the anode of the silicon thin film solar cell and the ITO thin film are isolated by the SiN$_x$ thin film. The same switching apparatus as that shown in FIG. 5A is formed (though the external variable impedance is not added), and the switching apparatus is coupled to a capacitor. The anode and the cathode of the first set of the silicon thin film solar cell located at the anode edge of the silicon thin film solar cell module and the ITO thin film are respectively coupled to the switching apparatus to form a single tunable PV-EC device out of the three sets of the serially connected PV-EC module. Since the silicon thin film solar cell module is composed of three silicon thin film solar cells, and thus three sets of switching apparatuses are employed to control each single device.

A solid electrolyte is formed by adding 5 wt % poly ethylene oxide (PEO) to 0.1M tetrabutylammonium tetrafluoroborate (TBABF4)/propylene carbonate. The entire silicon thin film solar cell module is covered by the solid electrolyte, and the control mode of the switching apparatus is set to the charging-EC mode with power supplied by the silicon thin film solar cell.

When sunlight irradiates the above device, within one minute, the Prussian blue thin film starts to change color, i.e., gradually from transparent colorless to light blue and further to light green. The control mode of the switching apparatus is then set to bleaching mode, and it can be observed that the Prussian blue thin film is gradually changed from light green and then light blue and finally back to transparent colorless within one minute. Thereby, it is proven that the reverse potential applied to the EC thin film from the capacitor leads to the bleaching effect. Thus, the feasibility of the single tunable PV-EC module can be verified.

Based on the second experiment, it can be concluded that the color of the Prussian blue thin film is changed to light green after light irradiation mainly because of over-oxidation. When the silicon thin film solar cell module is in direct contact with the electrolyte, electricity generated between the solar cells are unbalanced because the silicon thin film solar cells are connected in series. As a result, over-oxidation is likely to occur near the anode edge of the module, and over-reduction easily occurs near the cathode edge of the module. As such, even though the anode layers of each set of thin film solar cell have the same plated Prussian blue thin film, the tint due to light irradiation of the two set of the thin film solar cell located at the two edges of the silicon thin film solar cell module are different.

The following third, fourth, and fifth experiments sequentially provide module structures with the following configuration: discontinuous stripe shaped solid electrolyte, external variable impedances and serial connection of EC systems are used for so as to obtain tunable PV-EC modules with uniform coloring effect.

Third Experiment

In the third experiment, a discontinous stripe-shaped solid electrolyte on a surface of a single device (a single set of the silicon thin film solar cell) in the tunable PV-EC module is mutually independent and is not in contact with the stripe-shaped solid electrolytes of the other thin film solar cells (the structure is similar to FIG. 9).

Figure 15:
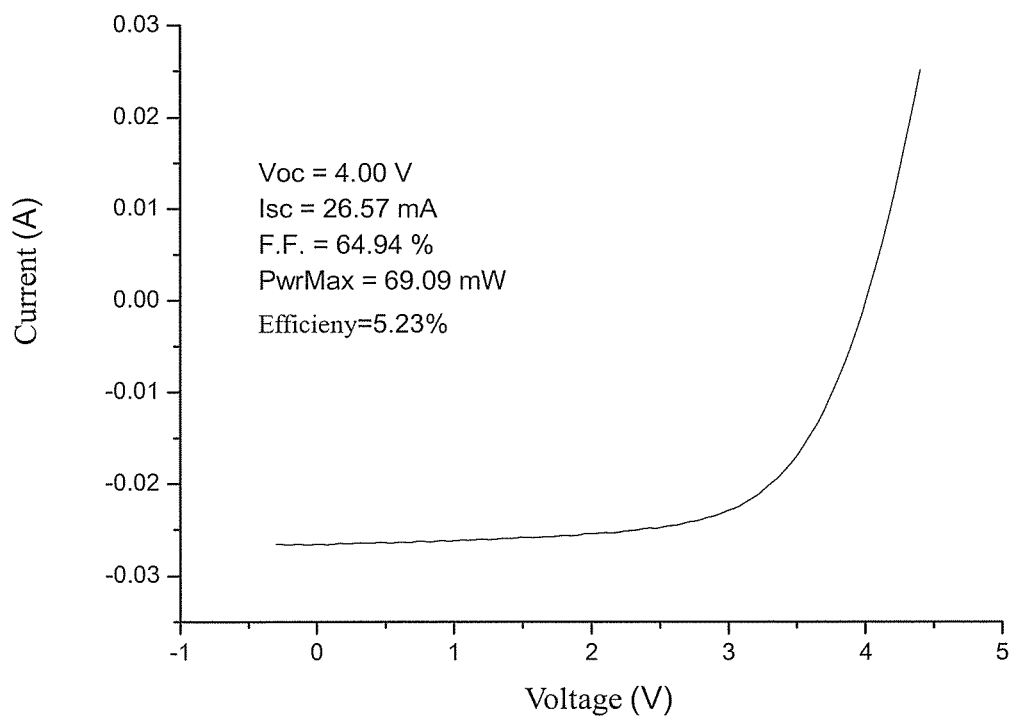
FIG. 15 is an I-V curve diagram illustrating the characteristics of photoelectric conversion of a silicon thin film solar cell module according to a third experiment.

A first transparent glass substrate of 3 cm×4 cm is prepared, and three sets of silicon thin film solar cells connected in series are formed thereon. An anode area and a cathode area of each set of the silicon thin film solar cell are respectively 0.5 cm×4 cm, and the anode is exposed between the cathodes. An I-V curve of the silicon thin film solar cell module is shown in FIG. 15, wherein Voc=4.00 volts, Isc=26.57 mA, F.F %=64.94%, PwrMax=69.09 mW, and power generating efficiency=5.23%. (The power generating efficiency of the module is calculated based on the actual area where electricity is generated.)

A SiN$_x$ thin film, an ITO thin film, and a Prussian blue thin film are sequentially formed on most of the anode area exposed between a single silicon thin film solar cell in the silicon thin film solar cell module through a semiconductor fabrication process, and a peripheral portion of anode area is exposed from the SiN$_x$ thin film and the Prussian blue thin film. The circuit of the switching apparatus is formed on a circuit board according to the same method as that in the second experiment, and the switching apparatus is coupled to a capacitor. The anode and the cathode of a single set of the silicon thin film solar cell and the ITO thin film are then respectively coupled to the switching apparatus to form a single tunable PV-EC device out of the three set of the PV-EC module. Based on said circuit design, the Prussian blue thin film on the surface of the ITO layer undergoes light induced coloring or bleaching, which is controlled by the switching apparatus. A solid electrolyte is prepared by adding 5 wt % PEO to 0.1M TBABF4/propylene carbonate. The stripe shaped solid electrolyte covers each set of the thin film solar cell with Prussian blue thin film on the anode of the thin film solar cell (the peripheral portion of the anode which is not coated with SiN$_x$ is excluded) and forms a single tunable PV-EC device, and the control mode of the switching apparatus is set to the charging-EC mode with power supplied by the silicon thin film solar cell.

In the third experiment, the stripe-shaped solid electrolyte in each single tunable PV-EC device is mutually independent, and the coverage area includes a pair of thin film solar cell (one anode and one cathode). Note that the stripe shaped solid electrolyte of one PV-EC device is not in contact with the stripe-shaped solid electrolytes in the adjacent PV-EC devices.

According to the above-mentioned method, the cations and anions in each tunable PV-EC device can be confined within the stripe-shaped solid electrolyte of a single device, and charge imbalance caused by covering a continuous electrolyte layer on the serially connected thin film solar cell module can be avoided. Moreover, the color change of the device caused by light irradiation as described in the third experiment can have a better uniformity.

When sunlight irradiates the above module, within one minute, the Prussian blue thin film starts to change color, i.e., gradually from transparent colorless to light blue, and no over-oxidation reaction occurs at the first set of the silicon thin film solar cell. Thereby, it can be proven that a tunable PV-EC module having a plurality of stripe-shaped solid electrolyte with each single stripe individually covering each set/pair of thin film solar cell can effectively mitigate the phenomenon of charge imbalance, so as to have a better uniformity in color change during light irradiation.

The control mode of the switching apparatus is then set to a non-charging and bleaching mode, and it can be observed that the Prussian blue thin film on the surface of the ITO layer is gradually changed from light blue to transparent colorless within one minute. Further, the design of the stripe-shaped solid electrolyte is proven to be conducive to improvement of color evenness of the tunable PV-EC module.

Fourth Experiment

Applying Variable Impedances to Improve Color Evenness

In the fourth experiment, the tunable PV-EC module shares one single solid electrolyte layer. Here, each of the serially connected thin film solar cells simultaneously contacts the solid electrolyte, and external variable impedances are used to improve color changing evenness of the devices.

The same silicon thin film solar cell module as that in the third experiment is prepared, and a $SiN_x$ thin film, an ITO thin film, and a Prussian blue thin film are sequentially formed on the anode area exposed between each set of silicon thin film solar cell in the silicon thin film solar cell module through a semiconductor fabrication process, while reserving a small portion of the peripheral anode area uncoated by the $SiN_x$ thin film and the Prussian blue thin film. The switching apparatus is formed according to the same method as that in the third experiment, and the switching apparatus is coupled to a capacitor. The anode and the cathode of a single set of the silicon thin film solar cell and the ITO layer are then respectively coupled to the switching apparatus to foil a tunable PV-EC module.

A transparent glass substrate of 10 cm×10 cm is prepared. A solid electrolyte is prepared by adding 5 wt % PEO to 0.1M TBABF4/propylene carbonate. The solid electrolyte covers the transparent glass substrate, and the silicon thin film solar cell module covers the solid electrolyte. The control mode of the switching apparatus of each set of the silicon thin film solar cell is set to the charging-EC mode with power supplied by the silicon thin film solar cell.

The external loop impedance capable of tuning an impedance value is applied to individually control a color changing degree of each thin film solar cell. The present experiment applies the common anode variable impedances. According to the circuit design of the common anode variable impedance, the same numbers of variable impedances as that of the silicon thin film solar cells are employed. One end of each of the external variable impedances is connected to the common anode, and the other ends thereof are respectively coupled to the cathodes of the silicon thin film solar cells. In the third experiment, there are three sets of PV-EC device in the silicon thin film solar cell module, and thus three sets of the variable impedances are respectively coupled to the common anode. The resistance of the variable impedance is in a range from 10 ohm to 2M ohm.

The control mode of the switching apparatus is set to the charging-EC mode with power supplied by each set of the silicon thin film solar cell. When sunlight irradiates the above device, within one minute, the Prussian blue thin film in each set of silicon thin film solar cell (single tunable PV-EC device) starts to change color, i.e., gradually from transparent colorless to light blue. Said circuit design leads to balanced charge distribution of each of the thin film solar cells as the device is colored due to light irradiation, so as to ensure uniformity in color change of the tunable PV-EC module having the serially connected structures.

The control mode of the switching apparatus is then set to a non-charging and bleaching mode, and it can be observed that the Prussian blue thin film is gradually changed from light blue to transparent colorless within one minute.

Fifth Experiment

Applying an EC System for Serial Connection

In the fifth experiment, the tunable PV-EC module utilises the EC system for serial connection. Three single silicon thin film solar cells that are the same as those used in the first experiment are prepared, and a $SiN_x$ thin film, an ITO thin film, and a Prussian blue thin film are sequentially formed on each anode area of the silicon thin film solar cells through a semiconductor fabrication process, while reserving a small portion of the peripheral anode area uncoated. The switching apparatus is formed according to the same method as that depicted in FIG. 7, and the switching apparatus is coupled to a capacitor. The anode and the cathode of a single set/pair of the silicon thin film solar cell and the ITO layer are then respectively coupled to the switching apparatus to form a tunable PV-EC device.

A solid electrolyte is prepared by adding 5 wt % PEO to 0.1M TBABF4/propylene carbonate.

The anode of a single silicon thin film solar cell is connected to the cathode of the next silicon thin film solar cell through the above solid electrolyte, such that the solid electrolyte respectively covers the area of a Prussian blue thin film coated on the anode of a single silicon thin film solar cell and the cathode of the next silicon thin film solar cell. Moreover, each of the stripe-shaped solid electrolytes is independent from each other and is not in contact with the stripe-shaped solid electrolytes of the other silicon thin film solar cells.

The anode layer located below the transparent conductive layer under a stripe-shaped solid electrolyte is not connected to the anode layer of the silicon thin film solar cell under the same stripe-shaped solid electrolyte.

The stripe-shaped solid electrolyte in each set of the tunable thin film solar cell (PV-EC device) serially connected to form tunable PV-EC module is independent from each other, and the coverage area includes a pair of Prussian blue thin film and a cathode of the thin film solar cell under the same stripe-shaped solid electrolyte. Note that the stripe-shaped solid electrolyte is not in contact with the striped-shaped solid electrolytes in the other PV-EC devices.

The control mode of the switching apparatus is set to the charging-EC mode with power supplied by a single silicon thin film solar cell. When sunlight irradiates the above device, within one minute, the Prussian blue thin film on the surface of the anode of each silicon thin film solar cell starts to change color, i.e., gradually from transparent colorless to light blue. In the above serially connected structure, the stripe-shaped electrolyte is used to serially connect a single silicon thin film solar cell to the next silicon thin film solar cell to form a single tunable PV-EC device. Therefore, the distribution of the cations and anions is confined within the stripe-shaped electrolyte, so as to achieve an effect of color changing evenness of the tunable PV-EC module having the serially connected structures.

To sum up, according to the device design described in the exemplary embodiments, the EC system and the thin film solar cell share a common cathode, and the anode of the EC system is an independent transparent conductive layer. An external circuit design is applied to control a potential difference between the anode and the cathode of the EC system and the current generated therebetween, so as to form a device switch. Moreover, according to the device design described in the exemplary embodiments, the EC systems are connected in series, and an external circuit design can be applied to control a potential difference between the tunable PV-EC devices, so as to form a device switch. Therefore, the PV-EC device and module can be easily tuned based on the preset switch control signals.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided they fall within the scope of the following claims and their equivalents.

What is claimed is:

1. A tunable photovoltaic electrochromic device at least comprising:
    a transparent substrate;
    a thin film solar cell located on the transparent substrate and at least having an anode layer, a cathode layer, and a photoelectric conversion layer between the anode layer and the cathode layer;
    a first transparent conductive layer located on the transparent substrate beside the thin film solar cell, wherein the first transparent conductive layer and the thin film solar cell are not mutually contacted;
    an electrochromic material at least covering an exposed surface of the first transparent conductive layer and the thin film solar cell; and
    a first switching apparatus electrically connected to the first transparent conductive layer and electrically connected to the anode layer and the cathode layer of the thin film solar cell, wherein the first switching apparatus enters a control mode through at least one switch control signal.

2. The tunable photovoltaic electrochromic device as recited in claim 1, wherein the electrochromic material is a solution type electrochromic material.

3. The tunable photovoltaic electrochromic device as recited in claim 1, the electrochromic material comprising:
    a first electrochromic thin film located on the first transparent conductive layer; and
    a gel electrolyte or a solid electrolyte, covering the first electrochromic thin film and the thin film solar cell.

4. The tunable photovoltaic electrochromic device as recited in claim 1, the anode layer of the thin film solar cell having an exposed surface, the tunable photovoltaic electrochromic device further comprising:
    a first insulation layer located on the exposed surface of the anode layer,
    the first transparent conductive layer being located on the first insulation layer.

5. The tunable photovoltaic electrochromic device as recited in claim 4, wherein the electrochromic material is a solution type electrochromic material.

6. The tunable photovoltaic electrochromic device as recited in claim 4, the electrochromic material comprising:
    a first electrochromic thin film located on the first transparent conductive layer; and
    a gel electrolyte or a solid electrolyte, covering the first electrochromic thin film and the thin film solar cell.

7. The tunable photovoltaic electrochromic device as recited in claim 1, further comprising:
    a second insulation layer located on the cathode layer of the thin film solar cell;
    a second transparent conductive layer located on the second insulation layer; and
    a second switching apparatus electrically connected to the second transparent conductive layer and electrically connected to the anode layer and the cathode layer of the thin film solar cell, wherein the second switching apparatus enters the control mode through the at least one switch control signal.

8. The tunable photovoltaic electrochromic device as recited in claim 7, wherein the electrochromic material is a solution type electrochromic material.

9. The tunable photovoltaic electrochromic device as recited in claim 7, the electrochromic material comprising:
    a first electrochromic thin film located on the first transparent conductive layer; and
    a gel electrolyte or a solid electrolyte, covering the first electrochromic thin film and the thin film solar cell.

10. The tunable photovoltaic electrochromic device as recited in claim 7, the electrochromic material comprising:
    a second electrochromic thin film located on the second transparent conductive layer; and
    a gel electrolyte or a solid electrolyte, covering the second electrochromic thin film and the first transparent conductive layer.

11. The tunable photovoltaic electrochromic device as recited in claim 7, further comprising an ion storage layer located on the second transparent conductive layer.

12. The tunable photovoltaic electrochromic device as recited in claim 7, further comprising a second charge-discharge device coupled to the second switching apparatus to store current received from the thin film solar cell and/or provide power to the second transparent conductive layer.

13. The tunable photovoltaic electrochromic device as recited in claim 1, further comprising a first charge-discharge device coupled to the first switching apparatus to store current received from the thin film solar cell and/or provide power to the first transparent conductive layer.

14. The tunable photovoltaic electrochromic device as recited in claim 1, further comprising a photoresistor thin film located on a surface of the cathode layer.

15. The tunable photovoltaic electrochromic device as recited in claim 1, further comprising at least one external loop impedance capable of tuning an impedance value, the at least one external loop impedance being coupled to the anode layer and the cathode layer of the thin film solar cell.

16. A tunable photovoltaic electrochromic module at least comprising:
    a transparent substrate;
    a plurality of thin film solar cells located on the transparent substrate, each of the thin film solar cells at least having an anode layer, a cathode layer, and a photoelectric conversion layer between the anode layer and the cathode layer, wherein one of the anode layer and the cathode layer has an exposed surface exposed between the thin film solar cells;
    a plurality of first transparent conductive layers respectively located on the exposed surface;

a plurality of first insulation layers respectively located between the exposed surface and each of the first transparent conductive layers;

a plurality of electrochromic materials respectively covering an exposed surface of at least one of the first transparent conductive layers and at least one of the thin film solar cells; and at least one first switching apparatus electrically connected to one of the first transparent conductive layers under one of the electrochromic materials and electrically connected to the anode layer and the cathode layer of one of the thin film solar cells under the one of the same electrochromic materials, wherein the at least one first switching apparatus enters a control mode through at least one switch control signal.

17. The tunable photovoltaic electrochromic module as recited in claim 16, wherein the thin film solar cells are connected in series.

18. The tunable photovoltaic electrochromic module as recited in claim 16, wherein the anode layer located below the one of the first transparent conductive layers under the one of the electrochromic materials and the anode layer of the one of the thin film solar cells under the one of the same electrochromic materials are not connected, and the at least one first switching apparatus is electrically connected to the one of the first transparent conductive layers under the one of the electrochromic materials and electrically connected to the anode layer and the cathode layer of the one of the thin film solar cells under the one of the same electrochromic materials.

19. The tunable photovoltaic electrochromic module as recited in claim 16, wherein the at least one first switching device is a single first switching device electrically connected to each of the first transparent conductive layers under one of the electrochromic materials and electrically connected to the anode layer and the cathode layer of each of the thin film solar cells under the one of the same electrochromic materials, and the tunable photovoltaic electrochromic module further comprises:

a single first charge-discharge device coupled to the single first switching apparatus to store current received from the thin film solar cells and/or provide power to the first transparent conductive layers; and a plurality of external loop impedances capable of tuning impedance values, the external loop impedances being coupled to the cathode layer of each of the thin film solar cells, the first transparent conductive layers, and the first charge-discharge device to individually control a color changing degree of each of the electrochromic materials.

20. The tunable photovoltaic electrochromic module as recited in claim 16, wherein each of the electrochromic materials is a solution type electrochromic material.

21. The tunable photovoltaic electrochromic module as recited in claim 16, wherein each of the electrochromic materials comprising:

a first electrochromic thin film located on the exposed surface of each of the first transparent conductive layers; and a gel electrolyte or a solid electrolyte, covering the first electrochromic thin film and the thin film solar cell.

22. The tunable photovoltaic electrochromic module as recited in claim 16, further comprising at least one first charge-discharge device coupled to the at least one first switching apparatus to store current received from the thin film solar cells and/or provide power to the first transparent conductive layers.

23. The tunable photovoltaic electrochromic module as recited in claim 16, further comprising a photoresistor thin film located on a surface of the cathode layer.

24. The tunable photovoltaic electrochromic module as recited in claim 16, further comprising at least one set of external loop impedance capable of tuning an impedance value, the at least one set of external loop impedance being coupled to at least one of the anode layers and at least one of the cathode layers of the thin film solar cells, so as to individually control a color changing degree of each of the electrochromic materials.

25. The tunable photovoltaic electrochromic module as recited in claim 24, the at least one set of external loop impedance capable of tuning the impedance value comprising a plurality of common anode variable impedances, one end of each of the common anode variable impedances being coupled to the anode layer of one of the thin film solar cells, the other end of each of the common anode variable impedances being coupled to the cathode layer of each of the thin film solar cells.

26. The tunable photovoltaic electrochromic module as recited in claim 24, the at least one set of external loop impedance capable of tuning the impedance value comprising a plurality of common cathode variable impedances, one end of each of the common cathode variable impedances being coupled to the cathode layer of one of the thin film solar cells, the other end of each of the common cathode variable impedances being coupled to the anode layer of each of the thin film solar cells.

27. The tunable photovoltaic electrochromic module as recited in claim 24, the at least one set of external loop impedance capable of tuning the impedance value comprising a plurality of common serially connected variable impedances, one end of each of the common serially connected variable impedances being coupled to the anode layer of one of the thin film solar cells, the other end of each of the common serially connected variable impedances being coupled to the cathode layer of another one of the thin film solar cells.

28. The tunable photovoltaic electrochromic module as recited in claim 24, the at least one set of external loop impedance capable of tuning the impedance value comprising a head-to-tail connected variable impedance coupled to the anode layer of the thin film solar cell at one edge and the cathode layer of the thin film solar cell at another edge.

29. The tunable photovoltaic electrochromic module as recited in claim 16, wherein when the anode layer has the exposed surface, the tunable photovoltaic electro chromic module further comprises:

a plurality of second insulation layers located on the cathode layers of the thin film solar cells;

a plurality of second transparent conductive layers located on the second insulation layers; and at least one second switching apparatus electrically connected to one of the second transparent conductive layers and electrically connected to the anode layer and the cathode layer of one of the thin film solar cells, the at least one second switching apparatus entering the control mode through the at least one switch control signal.

30. The tunable photovoltaic electrochromic module as recited in claim 29, wherein the thin film solar cells are connected in series.

31. The tunable photovoltaic electrochromic module as recited in claim 29, wherein the anode layer located below the one of the first transparent conductive layers under the one of the electrochromic materials and the anode layer of the one of the thin film solar cells under the one of same the electrochromic materials are not connected, and the at least one second switching apparatus is electrically connected to the one of the second transparent conductive layers under the one of the electrochromic materials and electrically connected to the anode layer and the cathode layer of the one of the thin film solar cells under the one of the same electrochromic materials.

32. The tunable photovoltaic electrochromic module as recited in claim 29, wherein the at least one second switching device is a single second switching device electrically connected to each of the second transparent conductive layers under one of the electrochromic materials and electrically connected to the anode layer and the cathode layer of one of the thin film solar cells under the one of the same electrochromic materials, and the tunable photovoltaic electrochromic module further comprises:
 a single second charge-discharge device coupled to the at least one second switching apparatus to store current received from the thin film solar cells and/or provide power to the second transparent conductive layers; and
 a plurality of external loop impedances capable of tuning impedance values, the external loop impedances being coupled to the cathode layer of each of the thin film solar cells, the second transparent conductive layers, and the second charge-discharge device to individually control a color changing degree of each of the electrochromic materials.

33. The tunable photovoltaic electrochromic module as recited in claim 29, wherein each of the electrochromic materials is a solution type electrochromic material.

34. The tunable photovoltaic electrochromic module as recited in claim 29, wherein each of the electrochromic materials comprising:
 a first electrochromic thin film located on the exposed surface of each of the first transparent conductive layers; and
 a gel electrolyte or a solid electrolyte, covering the first electrochromic thin film and the thin film solar cell.

35. The tunable photovoltaic electrochromic module as recited in claim 29, wherein each of the electrochromic materials comprising:
 a second electrochromic thin film located on an exposed surface of each of the second transparent conductive layers; and
 a gel electrolyte or a solid electrolyte, covering the second electrochromic thin film and the first transparent conductive layer.

36. The tunable photovoltaic electrochromic module as recited in claim 29, further comprising at least one first charge-discharge device coupled to the at least one first switching apparatus to store current received from the thin film solar cells and/or provide power to the first transparent conductive layers.

37. The tunable photovoltaic electrochromic module as recited in claim 29, further comprising an ion storage layer located on the second transparent conductive layer.

38. The tunable photovoltaic electrochromic module as recited in claim 29, further comprising at least one second charge-discharge device coupled to the at least one second switching apparatus to store current received from the thin film solar cells and/or provide power to the second transparent conductive layers.

39. The tunable photovoltaic electrochromic module as recited in claim 29, further comprising a photoresistor thin film located on a surface of each of the cathode layers.

40. The tunable photovoltaic electrochromic module as recited in claim 29, further comprising at least one set of external loop impedance capable of tuning an impedance value, the at least one set of external loop impedance being coupled to at least one of the anode layers and at least one of the cathode layers of the thin film solar cells, so as to individually control a color changing degree of each of the electrochromic materials.

41. The tunable photovoltaic electrochromic module as recited in claim 40, the at least one set of external loop impedance capable of tuning the impedance value comprising a plurality of common anode variable impedances, one end of each of the common anode variable impedances being coupled to the anode layer of one of the thin film solar cells, the other end of each of the common anode variable impedances being coupled to the cathode layer of each of the thin film solar cells.

42. The tunable photovoltaic electrochromic module as recited in claim 40, the at least one set of external loop impedance capable of tuning the impedance value comprising a plurality of common cathode variable impedances, one end of each of the common cathode variable impedances being coupled to the cathode layer of one of the thin film solar cells, the other end of each of the common cathode variable impedances being coupled to the anode layer of each of the thin film solar cells.

43. The tunable photovoltaic electrochromic module as recited in claim 40, the at least one set of external loop impedance capable of tuning the impedance value comprising a plurality of common serially connected variable impedances, one end of each of the common serially connected variable impedances being coupled to the anode layer of one of the thin film solar cells, the other end of each of the common serially connected variable impedances being coupled to the cathode layer of another one of the thin film solar cells.

44. The tunable photovoltaic electrochromic module as recited in claim 40, the at least one set of external loop impedance capable of tuning the impedance value comprising a head-to-tail connected variable impedance coupled to the anode layer of the thin film solar cell at one edge and the cathode layer of the thin film solar cell at another edge.

* * * * *